(12) United States Patent  
Gwynne

(10) Patent No.: US 12,249,981 B2  
(45) Date of Patent: *Mar. 11, 2025

(54) ZERO EXCESS ENERGY STORAGE TRANSFORMER

(71) Applicant: Quantum Power Transformation Limited, Cambridge (GB)

(72) Inventor: Robert William Gwynne, Cambridge (GB)

(73) Assignee: QUANTUM POWER TRANSFORMATION LIMITED, Cambridge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 18/234,097

(22) Filed: Aug. 15, 2023

(65) Prior Publication Data

US 2023/0387911 A1 Nov. 30, 2023

Related U.S. Application Data

(63) Continuation of application No. 17/038,958, filed on Sep. 30, 2020, now Pat. No. 11,764,776, which is a (Continued)

(30) Foreign Application Priority Data

Aug. 17, 2016 (GB) ...................................... 1614075

(51) Int. Cl.
*H01F 17/06* (2006.01)
*B23H 1/02* (2006.01)
(Continued)

(52) U.S. Cl.
CPC ........... *H03K 17/687* (2013.01); *B23H 1/022* (2013.01); *B41J 2/04541* (2013.01);
(Continued)

(58) Field of Classification Search
None
See application file for complete search history.

(56) References Cited

U.S. PATENT DOCUMENTS

| 4,338,657 A | 7/1982 | Lisin et al. |
| 5,335,161 A | 8/1994 | Pellegrino et al. |

(Continued)

FOREIGN PATENT DOCUMENTS

| EP | 0899102 A2 | 3/1999 |
| EP | 0913255 A2 | 5/1999 |

(Continued)

OTHER PUBLICATIONS

U.S. Appl. No. 16/325,972, "Non-Final Office Action", Feb. 18, 2020, 8 pages.

(Continued)

*Primary Examiner* — Kenneth B Wells
(74) *Attorney, Agent, or Firm* — Kilpatrick Townsend & Stockton LLP

(57) ABSTRACT

A drive circuit configured to drive a load. The drive circuit comprises a transformer. The transformer comprises a transformer primary comprising one or more primary windings connected to arms that pass through a magnetic material. The transformer also comprises a transformer secondary comprising secondary windings connected to planar secondary conductors which pass through the inside of the arms. The drive circuit also comprises a voltage source configured to apply a voltage across the transformer primary.

17 Claims, 28 Drawing Sheets

Related U.S. Application Data continuation-in-part of application No. 16/325,972, filed as application No. PCT/GB2017/052434 on Aug. 17, 2017, now Pat. No. 10,814,617.

(51) Int. Cl.

| | | |
|---|---|---|
| *B41J 2/045* | (2006.01) | |
| *G01R 27/26* | (2006.01) | |
| *H01F 27/24* | (2006.01) | |
| *H01F 27/28* | (2006.01) | |
| *H01F 27/32* | (2006.01) | |
| *H03K 17/687* | (2006.01) | |

(52) U.S. Cl.
CPC ......... *G01R 27/2605* (2013.01); *H01F 17/06* (2013.01); *H01F 27/24* (2013.01); *H01F 27/28* (2013.01); *H01F 27/32* (2013.01); *B23H 2300/22* (2013.01)

(56) References Cited

U.S. PATENT DOCUMENTS

| | | |
|---|---|---|
| 6,087,916 A | 7/2000 | Kutkut et al. |
| 6,130,541 A | 10/2000 | Ozguc |
| 6,885,728 B2 | 4/2005 | Hadland et al. |
| 6,954,060 B1 | 10/2005 | Edel |
| 7,023,317 B1 | 4/2006 | Herbert |
| 9,369,060 B2 | 6/2016 | Mao et al. |
| 10,814,617 B2 | 10/2020 | Gwynne |
| 11,764,776 B2 * | 9/2023 | Gwynne ............... H01F 17/06 327/111 |
| 2004/0085090 A1 | 5/2004 | Yazdy |
| 2005/0145611 A1 | 7/2005 | Blankenship et al. |
| 2008/0211847 A1 | 9/2008 | Shamoun |
| 2017/0303378 A1 | 10/2017 | Matilaine |
| 2018/0062605 A1 | 3/2018 | Brounley et al. |

FOREIGN PATENT DOCUMENTS

| | | |
|---|---|---|
| JP | 11340061 A | 12/1999 |
| SU | 1557593 A1 | 4/1990 |
| WO | 2012148399 A1 | 11/2012 |

OTHER PUBLICATIONS

U.S. Appl. No. 16/325,972, "Notice of Allowance", Jun. 19, 2020, 5 pages.
U.S. Appl. No. 17/038,958, "Non-Final Office Action", Feb. 9, 2023, 12 pages.
U.S. Appl. No. 17/038,958, "Notice of Allowance", May 16, 2023, 5 pages.
EP21200059.0, "Extended European Search Report", Feb. 28, 2022, 10 pages.
GB1614075.8, "Search Report", Oct. 30, 2017, 5 pages.
PCT/GB2017/052434, "International Search Report and Written Opinion", Nov. 6, 2017, 12 pages.

* cited by examiner

ZERO EXCESS ENERGY STORAGE TRANSFORMER

CROSS-REFERENCE TO RELATED APPLICATIONS

The present application is continuation of U.S. Nonprovisional patent application Ser. No. 17/038,958, filed Sep. 30, 2020, now U.S. Pat. No. 11,764,776, which is a continuation-in-part of and claims the benefit of priority to U.S. Nonprovisional patent application Ser. No. 16/325,972, filed Feb. 15, 2019, now U.S. Pat. No. 10,814,617, which is a 371 of international PCT/GB2017/052434, filed Aug. 17, 2017, which claims the benefit of priority to GB Patent Application No. 1614075.8, filed Aug. 17, 2016, the entirety of each of which is hereby incorporated by reference herein.

TECHNICAL FIELD

The present disclosure relates generally to a transformer. More specifically, but not by way of limitation, this disclosure relates to a transformer having a reduced leakage inductance (inductance in one winding that does not generate a magnetic field that induces a current in the other winding).

BACKGROUND

There are many applications in which a capacitive load is driven so as to effect mechanical movement of a material. For example, in a piezo-electric actuator, capacitive piezo-electric crystals are driven in order to cause mechanical movement of a material. The drive circuits for such applications are typically voltage driven. Charging and/or discharging of the capacitive load of the drive circuit between desired voltage levels at a desired charge rate can be achieved with high precision when the capacitive load has a known constant capacitance and the drive signal is specifically designed to drive this. However, for applications in which the capacitance of the load is not constant during an operation involving several charging cycles, the drive signal is not well matched to every one of the capacitive loads of the charging cycles. A compromise drive signal is selected. Typically, when the capacitive load is high, the compromise drive signal is unable to effect the desired charging rate. Whilst, when the capacitive load is low, the compromise drive signal causes significant overshooting of the maximum desired voltage level, undershooting of the minimum desired voltage level and ringing of the voltage level when the capacitive load is charged and discharged.

Thus, there is a need for improved drive electronics for driving capacitive loads and for improved transformers for driving circuitry which may include capacitive loads.

SUMMARY OF THE INVENTION

According to an aspect of the invention, there is provided circuitry for driving a variable capacitive load comprising: a variable capacitive load; a digital control circuit configured to generate a digital drive signal; and a drive circuit configured to convert the digital drive signal into an analogue drive signal, the analogue drive signal forming a drive waveform for charging the variable capacitive load, the drive circuit comprising a slewing circuit configured to drive a time dependent voltage component of the drive waveform; wherein the digital control circuit is configured to modify the digital drive signal for each charging cycle so as to match the time dependent voltage component of the drive waveform to the variable capacitive load.

The digital control circuit may be configured to modify the digital drive signal so as to cause the time dependent voltage component of the drive waveform to maintain a constant slew rate during charging of the variable capacitive load.

The analogue drive signal may further form a drive waveform for discharging the variable capacitive load, and the digital control circuit may be configured to modify the digital drive signal so as to cause the time dependent voltage component of the drive waveform to maintain a constant slew rate during discharging of the variable capacitive load.

The drive circuit may further comprise a keeper circuit coupled to the slewing circuit, the keeper circuit configured to drive a static voltage component of the drive waveform.

The slewing circuit may comprise a current source, and the digital control circuit may be configured to modify the digital drive signal so as to change the amplitude of the slewing circuit current driving the time dependent voltage component of the drive waveform.

The slewing circuit may comprise a current source, and the digital control circuit may be configured to modify the digital drive signal so as to change the period of the slewing circuit current driving the time dependent voltage component of the drive waveform.

The slewing circuit may comprise a voltage source, and the digital control circuit may be configured to modify the digital drive signal so as distort the analogue drive signal.

After discharging and during charging of the variable capacitive load, the digital control circuit may be configured to generate the digital drive signal so as to cause the keeper circuit to maintain a static voltage component of the drive waveform at a desired pre-charge value.

For each charging cycle, the digital control circuit may be configured to modify the desired pre-charge value so as to match the variable capacitive load.

After charging and during discharging of the variable capacitive load, the digital control circuit may be configured to generate the digital drive signal so as to cause the keeper circuit to maintain a static voltage component of the drive waveform at a desired pre-discharge value.

For each charging cycle, the digital control circuit may be configured to modify the desired pre-discharge value so as to match the variable capacitive load.

The digital control circuit may be configured to modify the digital drive signal for each charging cycle so as to match the time dependent voltage component of the drive waveform to a determined capacitance of the variable capacitive load for that charging cycle, wherein the capacitance of the variable capacitive load for that charging cycle is predetermined.

The predetermined capacitance of the variable capacitive load may be temperature dependent.

At any time the variable capacitive load may comprise an active subset of a set of capacitive loads, wherein the capacitance of each capacitive load is predetermined, and for each charging cycle, the digital control circuitry may be configured to: receive an indication of the active subset of capacitive loads for that charging cycle; and determine the variable capacitive load for that charging cycle based on the active subset of capacitive loads for that charging cycle and the predetermined capacitance of each capacitive load.

The predetermined capacitance of each capacitive load may be temperature dependent.

The predetermined capacitance of each capacitive load of the active subset may be the same.

At any time the variable capacitive load may comprises an active subset of a set of capacitive loads, and the digital control circuit may be configured to determine the capacitance of each capacitive load by: controlling that capacitive load only to be connected to the drive circuit; generating a test digital drive signal for driving that capacitive load only, the test drive signal for being converted by the drive circuit to a test analogue drive signal forming a test drive waveform for charging that capacitive load only; measuring the time dependent voltage component of the test drive waveform of that capacitive load; and deriving the capacitance of that capacitive load from the measured time dependent voltage component of the test drive waveform of that capacitive load.

The digital control circuit may be configured to measure the time dependent voltage component of the test drive waveform of that capacitive load by measuring the time dependent voltage component of the test analogue drive signal of that capacitive load.

The digital control circuit may be further configured to for each capacitive load, compare the maximum voltage of the measured time dependent voltage component of the test drive waveform of that capacitive load to a desired post-charge voltage.

The digital control circuit may be further configured to for each capacitive load, compare the minimum voltage of the measured time dependent voltage component of the test drive waveform of that capacitive load to a desired post-discharge voltage.

The digital control circuit may be further configured to determine the temperature dependence of the capacitance of each capacitive load by repeating the steps of: controlling that capacitive load only to be connected to the drive circuit; generating a test digital drive signal for driving that capacitive load only, the test drive signal for being converted by the drive circuit to a test analogue drive signal forming a test drive waveform for charging that capacitive load only; measuring the time dependent voltage component of the test drive waveform of that capacitive load; and deriving the capacitance of that capacitive load from the measured time dependent voltage component of the test drive waveform of that capacitive load, when the variable capacitive load has each of a set of temperatures.

The digital control circuit may be further configured to determine the temporal dependence of the capacitance of each capacitive load by repeating the steps of: controlling that capacitive load only to be connected to the drive circuit; generating a test digital drive signal for driving that capacitive load only, the test drive signal for being converted by the drive circuit to a test analogue drive signal forming a test drive waveform for charging that capacitive load only; measuring the time dependent voltage component of the test drive waveform of that capacitive load; and deriving the capacitance of that capacitive load from the measured time dependent voltage component of the test drive waveform of that capacitive load, when the variable capacitive load has been active for each of a set of time periods.

The digital control circuit may be configured to determine the capacitance of each capacitive load during manufacture so as to generate a predetermined capacitance of each capacitive load.

The digital control circuit may be configured to determine the capacitance of each capacitive load prior to an operational use of the variable capacitive so as to generate a predetermined capacitance of each capacitive load.

The digital control circuit may be configured to determine the capacitance of each capacitive load between charging cycles of the variable capacitive load.

The circuitry may further comprise a comparator configured to receive an indication of the drive waveform voltage and a threshold voltage, and change state when the drive waveform voltage crosses the threshold voltage.

The digital control circuit may be configured to halt outputting the digital drive signal to the drive circuit in response to the comparator changing state.

The indication of the drive waveform voltage may be the drive waveform voltage.

The indication of the drive waveform voltage may be the analogue drive signal voltage.

The digital control circuit may be configured to generate the threshold voltage, and the digital control circuit may be configured to modify the threshold voltage for each charging cycle so as to cause the maximum drive waveform voltage to match a desired post-charge voltage.

The digital control circuit may be configured to generate the threshold voltage, and the digital control circuit may be configured to modify the threshold voltage for each charging cycle so as to cause the minimum drive waveform voltage to match a desired post-discharge voltage.

The digital control circuit may be configured to detect the elapsed time in each charging cycle at which the comparator changes state.

The digital control circuit may be configured to detect the temperature of the variable capacitive load in each charging cycle at which the comparator changes state.

The digital control circuit may be configured to detect a fault in the variable capacitive load by adjusting the detected elapsed time for the detected temperature to form an adjusted detected elapsed time, and compare the adjusted detected elapsed time to at least one threshold time.

BRIEF DESCRIPTION OF THE FIGURES

The present invention will now be described by way of example with reference to the accompanying drawings. In the drawings.

DETAILED DESCRIPTION

The following describes circuitry for driving variable capacitive loads in which the signal which drives the charging (and optionally discharging) of the variable capacitive load is dynamically modified so as to match the current capacitance of the variable capacitive load.

Figure 1:
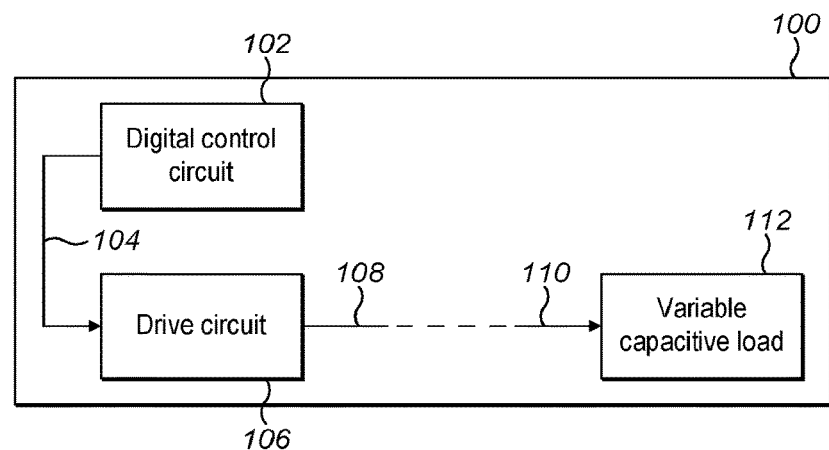
FIG. 1 illustrates drive circuitry of the invention.

The block diagram of FIG. 1 illustrates the principle components of the drive circuitry 100. Digital control circuit 102 generates and outputs a digital drive signal 104. Digital drive signal 104 is input to drive circuit 106 to control the operation of drive circuit 106. Drive circuit 106 converts the digital drive signal 104 into an analogue drive signal 108. Analogue drive signal 108 is output from drive circuit 108. Analogue drive signal 108 forms drive waveform 110 which drives the charging of the variable capacitive load 112. The analogue drive signal 108 morphs into the drive waveform 110 as it passes from the drive circuit 106 to the variable capacitive load 112.

The drive circuit comprises a slewing circuit which drives a time dependent voltage component of the analogue drive signal, and hence drives a time dependent voltage component of the drive waveform. The changing voltage over time of the time dependent voltage component of the drive waveform drives the charging of the variable capacitive load.

In order to precisely control the operation of the variable capacitive load, the rate of change of voltage over time of the drive waveform (the slew rate), the minimum voltage of the drive waveform (Vlow), and the maximum voltage of the drive waveform (Vhigh) are precisely controlled and maintained at their desired values as the capacitance of the variable capacitive load varies. In particular, the digital control circuit modifies the digital drive signal for each charging cycle so as to maintain a constant slew rate of the time dependent voltage component of the drive waveform during charging of the variable capacitive load. The digital control circuit may also modify the digital drive signal for each charging cycle so as to maintain a constant slew rate of the time dependent voltage component of the drive waveform during discharging of the variable capacitive load.

Circuitry 100 may be current driven or voltage driven. The specific capacitive load conditions of each charging cycle may be known in advance, or may be measured on the fly for each charging cycle or set of charging cycles in a feedback loop to the digital control circuit.

Circuitry 100 is applicable for use in driving variable capacitive loads in many technology areas. The following describes exemplary uses of circuitry 100 in printhead actuator driving, electro discharge machining and 3D metal printing.

In the following example, the circuitry of FIG. 1 is used to drive printhead actuators. The actuators may be one or both of piezoelectric and thin film MEMs actuators. Each printhead actuator is a capacitive load. Driving the capacitive load actuates the printhead nozzle and causes ink to be propelled from the nozzle onto a surface. The printer comprises a set of printhead actuators. The printer prints in print cycles. Each print cycle typically corresponds to a line of print. Only a subset of the printhead actuators is used on each print cycle to eject ink onto the surface. Thus, the active subset of printhead actuators is a variable capacitive load which varies by print cycle. The combined capacitance of the active subset of printhead actuators is the capacitance being driven by the drive circuitry on that print cycle.

Figure 2:
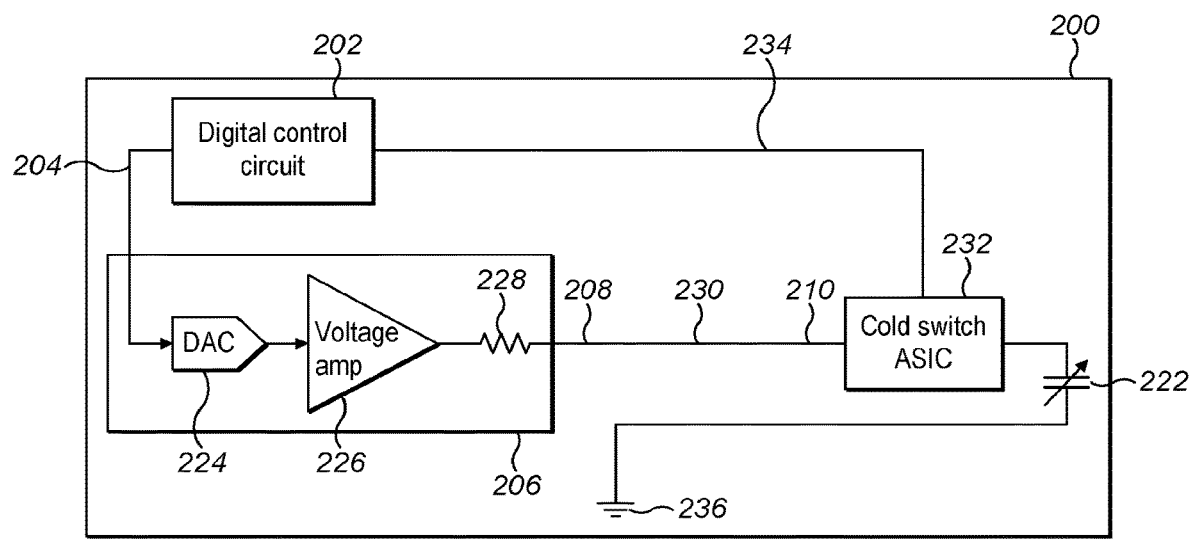
FIG. 2 illustrates a prior art inkjet actuator drive circuit.

FIG. 2 illustrates a known inkjet actuator drive circuit 200. The bank of printhead actuators is represented by variable capacitive load 222. Digital control circuitry 202 generates and outputs a voltage digital drive signal 204. Drive circuit 206 receives the voltage digital drive signal 204 and converts it to an analogue drive signal 208. Drive circuit 206 comprises a digital to analogue converter (DAC) 224, a voltage amplifier 226 and a resistor 228. The analogue drive signal comprises a time dependent voltage component. The analogue drive signal 208 propagates along cable 230 to form the drive waveform at the bank of printhead actuators. Cold switch application specific integrated circuit (ASIC) 232 switches the drive waveform through to the active subset of printhead actuators which are scheduled to eject ink in that print cycle. The cold switch ASIC receives a control signal 234 from digital control circuitry 202 which identifies which printhead actuators are active for that print cycle. The return current flows along the cable 230 to ground return 236. The time dependent voltage component of the drive waveform causes the active subset of printhead actuators to eject ink in each print cycle.

The voltage amplifier 226 is set up to drive both the minimum capacitance of the variable capacitive load when none of the printhead nozzles is ejecting ink on a print cycle, and the maximum capacitance of the variable capacitive load when all of the printhead nozzles are ejecting ink on a print cycle. The capacitance of the variable capacitive load may therefore vary between 0 nF and a few hundred nF. For example, the capacitance of the variable capacitive load may vary between 0 nF and 300 nF. When the capacitance of the variable capacitive load changes, this affects the slew rate of the drive waveform, the maximum and minimum voltages of the drive waveform, and the uniformity of the drive waveform.

Figure 3B:
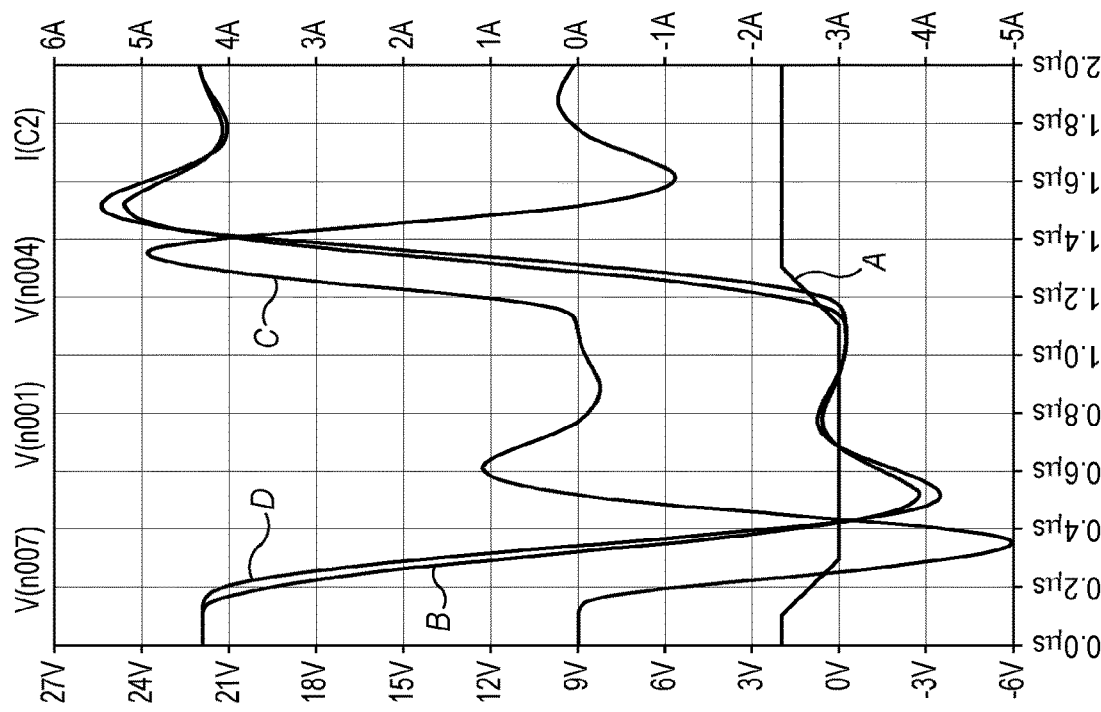
FIGS. 3a and 3b illustrate plots for charging cycles of a prior art capacitive load driving circuit.
Figure 3A:
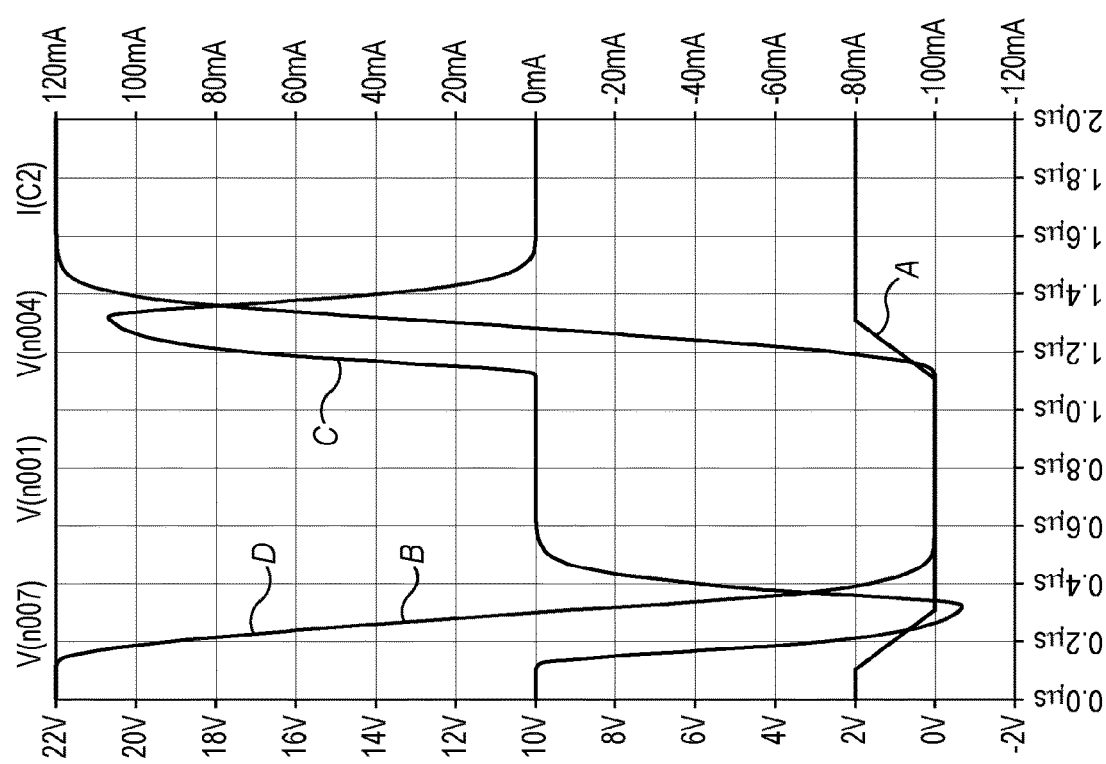

FIGS. 3a and 3b illustrate plots for an inkjet actuator drive circuit of the type shown in FIG. 2. In each figure, plot A is the drive signal input to the voltage amplifier 226, plot B is the analogue drive signal output from the drive circuit, plot C is the current of the drive waveform input to the variable capacitive load, and plot D is the voltage across the variable capacitive load. In FIGS. 3a and 3b, the inkjet actuator drive circuit is optimised to drive a capacitance of 1 nF. The capacitive load on FIG. 3a is 1 nF. The capacitive load on FIG. 3b is 40 nF. In FIG. 3a, the analogue voltage drive signal output from the drive circuit is coincident with the voltage across the variable capacitive load. This is because the inkjet actuator drive circuit has been optimised to drive the load of 1 nF. In FIG. 3b, the analogue drive signal output from the drive circuit is not coincident with the voltage across the variable capacitive load. The slew rate of plot D is not constant, the minimum voltage of plot D undershoots the intended minimum voltage of 0V, the maximum voltage of plot D overshoots the intended maximum voltage of 22V, and there is ringing of the voltage signal between the charging and discharging portions of plot D. Thus, the inkjet actuator drive circuit does not drive the capacitive load of 40 nF optimally. These factors lead to the printhead actuators not ejecting the ink as intended, and hence cause the quality of the resultant printed image being degraded. Specifically, in the system of FIG. 2, the amount of ink ejected from each nozzle is dependent on the number of nozzles actuated in that print cycle. Thus, the volume and velocity of the ejected ink droplets is data-dependent. The lifetimes of the actuators are also negatively affected by the mismatch between the inkjet actuator drive circuit's optimal capacitive load and its actual capacitive load on a print cycle. Specifically, the actuators are stressed by the signal ringing shown on FIG. 3b. Frequent exposure to this signal ringing reduces their mean time between failure (MTBF).

It is known to statically optimize the inkjet actuator drive circuit to drive the entire range of capacitive loads with the best average performance. The inkjet actuator drive circuit may be nominally optimised for the minimum, maximum or another capacitive load in the full range of capacitive loads, and compensated to ensure that the undershoot, overshoot and ringing issues shown in FIG. 3b are acceptable across the capacitive load range. However, this leads to a drive signal which is not well matched to every capacitive load of the range of variable capacitive loads, and hence to sub-optimal driving across the capacitive load range.

The drive waveform is distorted relative to the analogue drive signal in part due to considerable inductance caused by the length of the cable 230. It is known to minimise the length of the cable to reduce the inductance.

It is also known to perform data-dependent trimming of the control signal 234 at the digital control circuitry 202 in an effort to compensate for the data-dependency of the ink ejected from the actuator nozzles. Specifically, the number and size of the ink droplets that make up a full printed pixel may be modified on the basis of an algorithm that takes the number of nozzles printed on the current and previous rows into account. These digital domain trims require additional processing power and on-chip area, and do not remove all data dependent artefacts, and hence are an incomplete and undesirable solution.

Figure 4:
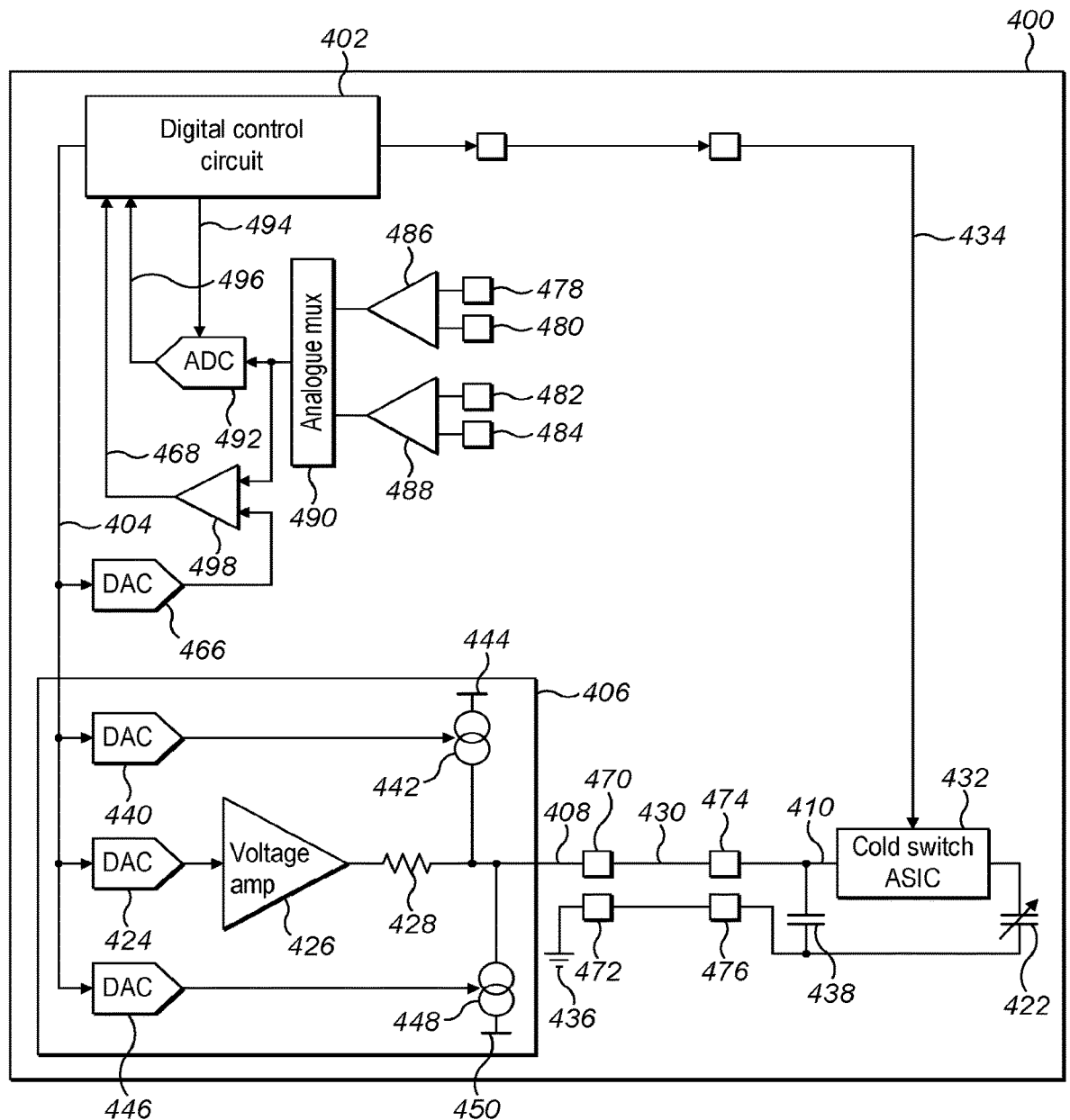
FIG. 4 illustrates a current drive circuit for driving printhead actuators.

FIG. 4 illustrates a first exemplary current drive circuit 400 for driving printhead actuators. The bank of printhead actuators is represented by variable capacitive load 422. Each printhead actuator may have a capacitance in the range of 200 to 1 nF. The bank of printhead actuators may comprise several hundred individual printhead actuators. In a typical print cycle, between 100 and 250 of the printhead actuators are actuated. If no pixels are to be printed in a print cycle, then no printhead actuators eject ink, and hence the capacitance of the variable capacitive load is 0 pf. If in a print cycle all the printhead actuators eject ink, then the capacitance of the variable capacitive load may be a few hundred nF.

Digital control circuitry 402 generates and outputs a current digital drive signal 404. Drive circuit 406 receives the current digital drive signal 404 and converts it to an analogue drive signal 408. The analogue drive signal 408 propagates along cable 430 to form the drive waveform at the bank of printhead actuators. Cable 430 may be a flexible printed circuit (FPC) or a flexible printed circuit board (PCB) cable. Cable 430 may be between 100 and 500 mm long and have parameters in the following ranges: 30-150 nH, 10-50 pF, 0.05-0.25 Ohms, 0.5-2.5 ns Tpd.

Cold switch application specific integrated circuit (ASIC) 432 switches the drive waveform through from the drive circuit 406 to the active subset of printhead actuators which are scheduled to eject ink in that print cycle. The cold switch ASIC receives a control signal 434 from digital control circuitry 402 which identifies which printhead actuators are active for that print cycle. For example, the control signal 434 may comprise pixel data. The control signal 434 may identify the pixel data for each print row. The cold switch ASIC 432 connects the drive waveform 410 through to the subset of printhead actuators indicated by the pixel data for that print cycle. The time dependent voltage component of the drive waveform causes the active subset of printhead actuators to eject ink in each print cycle. Capacitor 438 is connected in parallel with variable capacitive load 422. Capacitor 438 is separated from variable capacitive load 422 by cold switch ASIC 432. Capacitor 438 may have a capacitance of ~1 nF. The return current flows along the cable 430 to ground return 436.

Drive circuit 406 comprises a keeper circuit coupled to a slewing circuit. The keeper circuit comprises a digital to analogue converter (DAC) 424, a voltage amplifier 426 and a resistor 428. The current digital drive signal 404 is input to the DAC 424. The output of the DAC 424 is input to voltage amplifier 426. The output of voltage amplifier 426 is input to resistor 428. The keeper circuit drives a static voltage component of the analogue drive signal. Hence, the keeper circuit drives a static voltage component of the drive waveform. Circuit 400 achieves this by the digital drive signal 404 driving DAC 424 at all times. Resistor 428 may have a resistance in the range of 100-1000 Ohms. The output of the voltage amplifier 426 is driven through this resistor to provide a low drive strength static voltage component to the analogue drive signal. After discharging the actuators and during charging of the actuators, the digital control circuit 402 generates the digital drive signal 404 so as to cause the keeper circuit to maintain the static voltage component of the drive waveform at a desired pre-charge value, Vlow. Vlow may be in the range 0-2V. After charging the actuators and during discharging of the actuators, the digital control circuit 402 generates the digital drive signal 404 so as to cause the keeper circuit to maintain the static voltage component of the drive waveform at a desired pre-discharge value, Vhigh. Vhigh may be in the range 20-40V. The keeper circuit compensates for leakage current through cold switch ASIC 432 and actuator bank 422 which would otherwise pull the voltage of the drive waveform 410 down. The keeper circuit maintains the DC level of the drive waveform 410 at the desired one of Vhigh and Vlow despite the leakage current.

The slewing circuit comprises DACs 440 and 446, each of which receives as an input the digital drive signal 404. The output of DAC 440 drives current source 442. Current source 442 is connected to high voltage rail 444. The high voltage rail 444 may be between 30 and 40V. The output of DAC 446 drives current source 448. Current source 448 is connected to low voltage rail 450. The low voltage rail 450 may be between −5 and −10V. The outputs of both current sources are connected to the output of resistor 428. The slewing circuit slews the voltage of the analogue drive signal from one voltage to another. Positive current from current source 442 ramps the voltage Vlow of the signal output from the keeper circuit up to Vhigh during charging of the printhead actuator bank. Negative current from current source 448 ramps the voltage Vhigh of the signal output from the keeper circuit down to Vlow during discharging of the printhead actuator bank. The slewing circuit drives the time dependent voltage component of the analogue drive signal. Hence, the slewing circuit drives the time dependent voltage component of the drive waveform. The slewing circuit does not provide current to the analogue drive signal at any other time. Thus, the drive circuit comprises the keeper circuit to maintain the DC level of the analogue drive signal at the desired level.

The digital drive signal 404 controls the characteristics of the charging current from current source 442 applied to the signal output from the keeper circuit. The digital drive signal 404 controls the characteristics of the discharging current from current source 448 applied to the signal output from the keeper circuit. The digital control circuit 402 may modify the digital drive signal 404 so as to change the amplitude and/or period of the charging current to match the positive voltage slew rate of the drive waveform to the variable capacitive load of the current charging cycle. The digital control circuit 402 may modify the digital drive signal 404 so as to change the amplitude and/or period of the discharging current to match the negative voltage slew rate of the drive waveform to the variable capacitive load of the current charging cycle.

Figure 5:
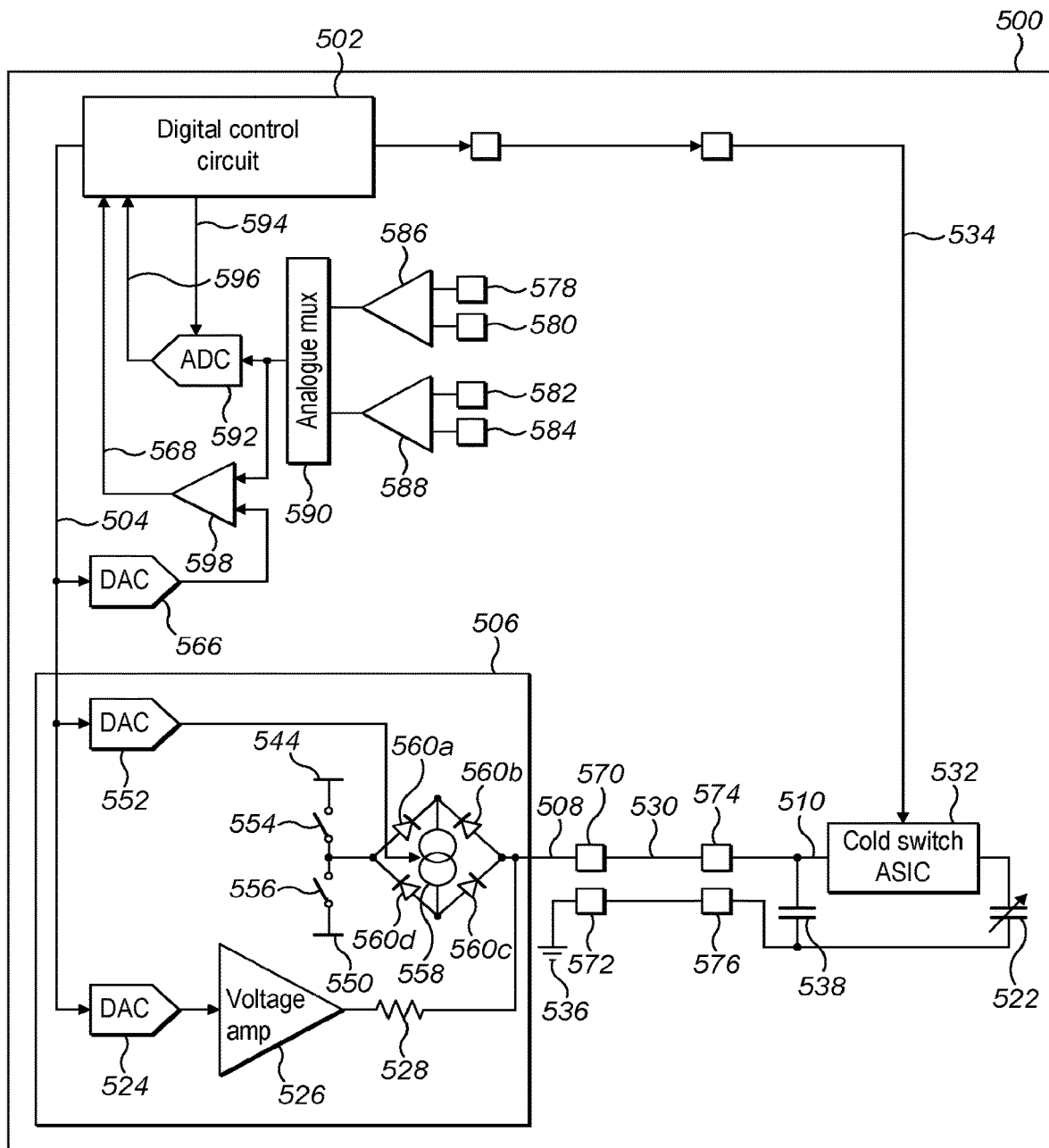
FIG. 5 illustrates a further current drive circuit for driving printhead actuators.

FIG. 5 illustrates a second exemplary current drive circuit 500 for driving printhead actuators. The current drive system of FIG. 5 is the same as that of FIG. 4 except that it has a different arrangement for the slewing circuit of the drive circuit 506. Those components in common with those of FIG. 4 are as described with reference to FIG. 4.

The slewing circuit of FIG. 5 comprises a DAC 552 which receives as an input the digital drive signal 504. The output of DAC 552 drives current source 558. High voltage rail 544 is connected to current source 558 via switch 554. The high voltage rail 544 may be between 30 and 40V. Low voltage rail 550 is connected to current source 558 via switch 556. The low voltage rail 550 may be between −5 and −10V. The output of current source 558 is connected to the output of resistor 528. One way diodes 560a,b,c,d surround current source 558, such that when switch 544 is closed and switch 556 open, the high voltage rail 544 connects to the current source through diode 560a which drives a charging current through diode 560c to the output of the keeper circuit. Thus, positive current from current source 558 ramps the voltage Vlow of the signal output from the keeper circuit up to Vhigh during charging of the printhead actuator bank. Meanwhile, when switch 556 is closed and switch 544 open, the low voltage rail 550 connects to the current source through diode 560d. The current source is connected to the output of the keeper circuit through diode 56b. Thus, negative current from current source 558 ramps the voltage Vhigh of the signal output from the keeper circuit down to Vlow during discharging of the printhead actuator bank. In this way, the slewing circuit slews the voltage of the analogue drive signal from one voltage to another. The slewing circuit drives the time dependent voltage component of the analogue drive signal. Hence, the slewing circuit drives the time dependent voltage component of the drive waveform. The slewing circuit does not provide current to the analogue drive signal at any other time. Thus, the drive circuit comprises the keeper circuit to maintain the DC level of the analogue drive signal at the desired level. The digital drive signal 504 controls the characteristics of the charging current and or/discharging current of FIG. 5 as described with reference to FIG. 4.

FIGS. 4 and 5 illustrate two exemplary current drive circuit arrangements for driving a variable capacitive load. However, it will be understood that any suitable slewing circuit arrangement may be implemented to slew the analogue drive signal between the DC voltage levels provided by the keeper circuit. For example, a high speed digital pulse width modulation (PWM) unit with an RF GaN pass transistor may be implemented instead of the analogue current sources shown in FIGS. 4 and 5.

Figure 6:
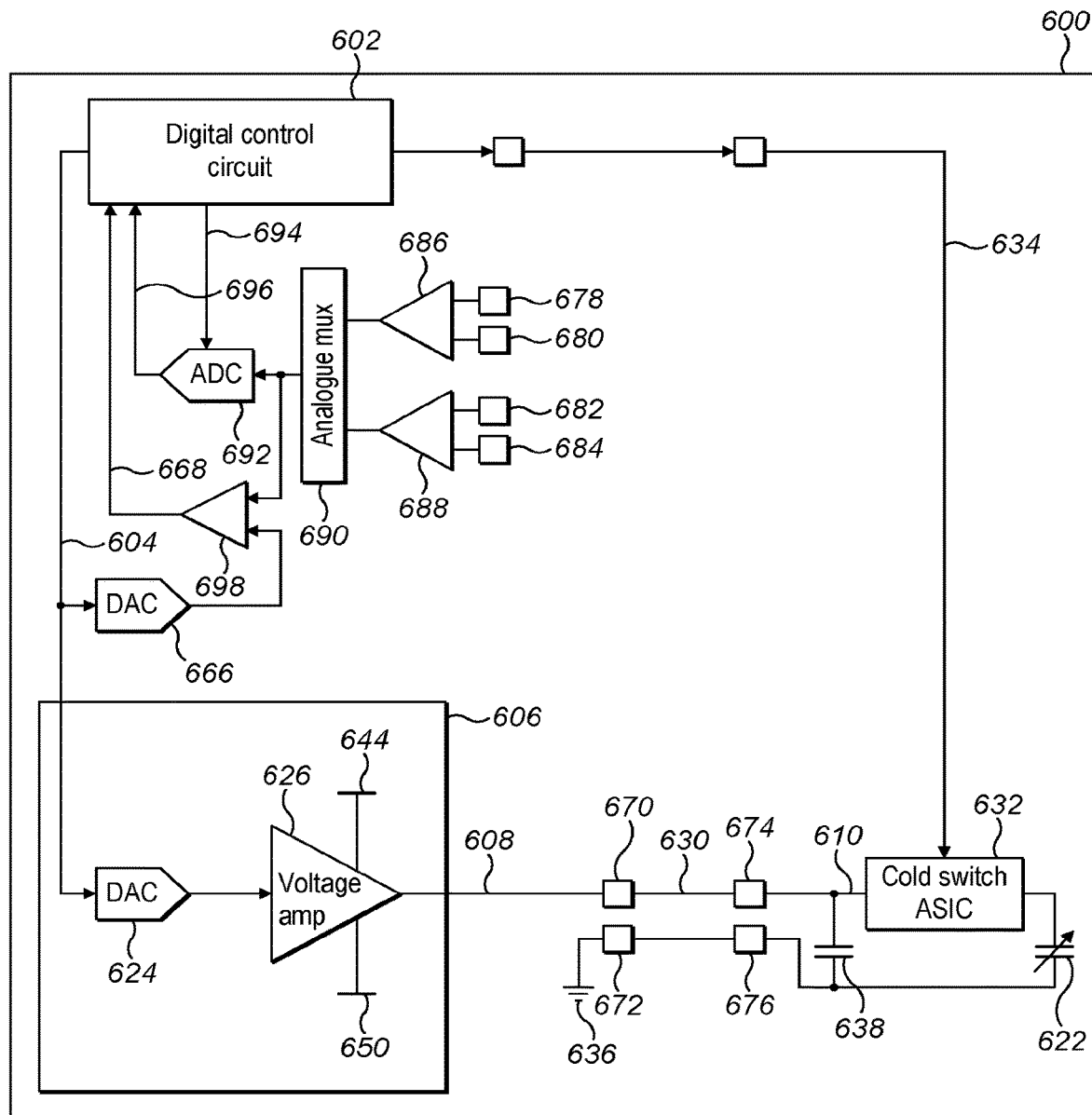
FIG. 6 illustrates a voltage drive circuit for driving printhead actuators.

FIG. 6 illustrates an exemplary voltage drive circuit 600 for driving printhead actuators. The voltage drive system of FIG. 6 is the same as that of FIGS. 4 and 5 except that it is voltage driven as opposed to current driven and has a different arrangement for the drive circuit 606. Those components in common with those of FIG. 4 are as described with reference to FIG. 4.

Digital control circuitry 602 generates and outputs a voltage digital drive signal 604. Drive circuit 606 receives the voltage digital drive signal 604 and converts it to an analogue drive signal 608. The analogue drive signal 608 converts to the drive waveform 610 and drives the actuator bank 622 under the control of digital control circuit 602 as described with reference to FIG. 4.

Drive circuit 606 comprises a digital to analogue converter (DAC) 624 and a voltage amplifier 626. The voltage digital drive signal 604 is input to the DAC 624. The output of the DAC 624 is input to voltage amplifier 626.

The voltage amplifier 626 is connected to high voltage rail 644 and low voltage rail 650. High voltage rail 644 may be between 30 and 40V. Low voltage rail 650 may be between −5 and −10V. The voltage amplifier generates an output having a voltage between the voltage of the high and low voltage rails. In accordance with the control signal from digital control circuit 602, the voltage output from the voltage amplifier slews from one voltage to another. The output of the voltage amplifier is the analogue drive signal. Positive voltage from voltage rail 644 ramps the voltage of the voltage amplifier output up to Vhigh during charging of the printhead actuator bank. Negative voltage from voltage rail 650 ramps the voltage of the voltage amplifier output down to Vlow during discharging of the printhead actuator bank.

The digital drive signal 604 controls the characteristics of the charging voltage from high voltage rail 644 applied to the voltage amplifier 626. The digital drive signal 604 controls the characteristics of the discharging voltage from low voltage rail 650 applied to the voltage amplifier 626. The digital control circuit 602 may modify the digital drive signal 604 so as to distort the analogue drive signal 608 such that the positive voltage slew rate of the drive waveform 610 is matched to the variable capacitive load of the current charging cycle. The digital control circuit 602 may modify the digital drive signal 604 so as to distort the analogue drive signal 608 such that the negative voltage slew rate of the drive waveform 610 is matched to the variable capacitive load of the current charging cycle.

FIG. 6 illustrates an exemplary voltage drive circuit arrangement for driving a variable capacitive load. However, it will be understood that any suitable drive circuit may be used to pre-distort the analogue drive signal to form a drive waveform 610 that is matched to the variable capacitive load of the current charging cycle.

As described above, whether the drive circuit for the printhead actuators is current driven as shown in FIGS. 4 and 5, or voltage driven as shown in FIG. 6, the digital control circuit dynamically modifies the digital drive signal for each printing cycle so as to match the time dependent voltage component of the drive waveform to the capacitance of the printhead actuators in that printing cycle.

Figure 7A:
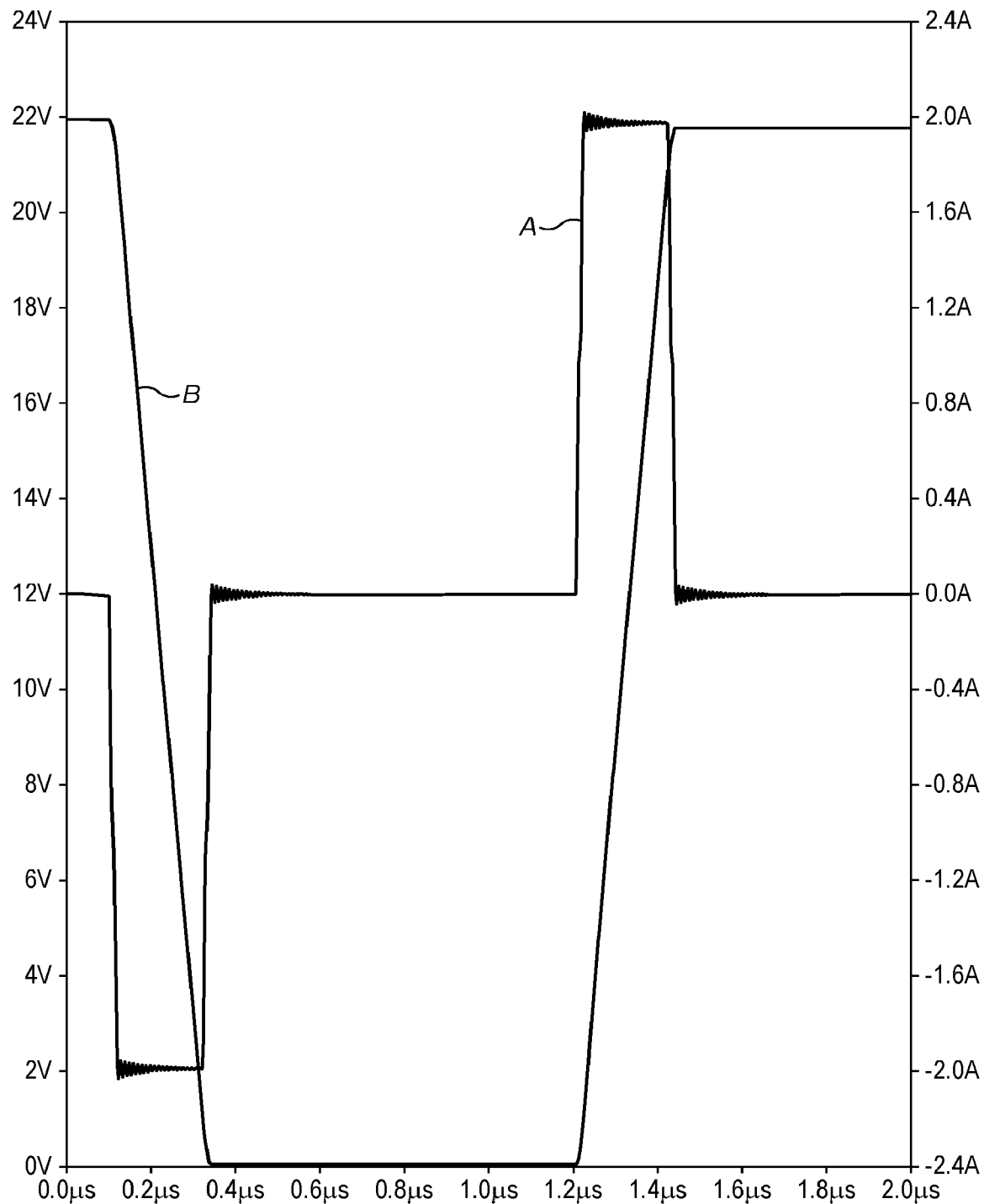
FIGS. 7a and 7b illustrate plots for charging cycles of a current driven printhead actuator circuit of the type shown in FIGS. 4 and 5.
Figure 7B:
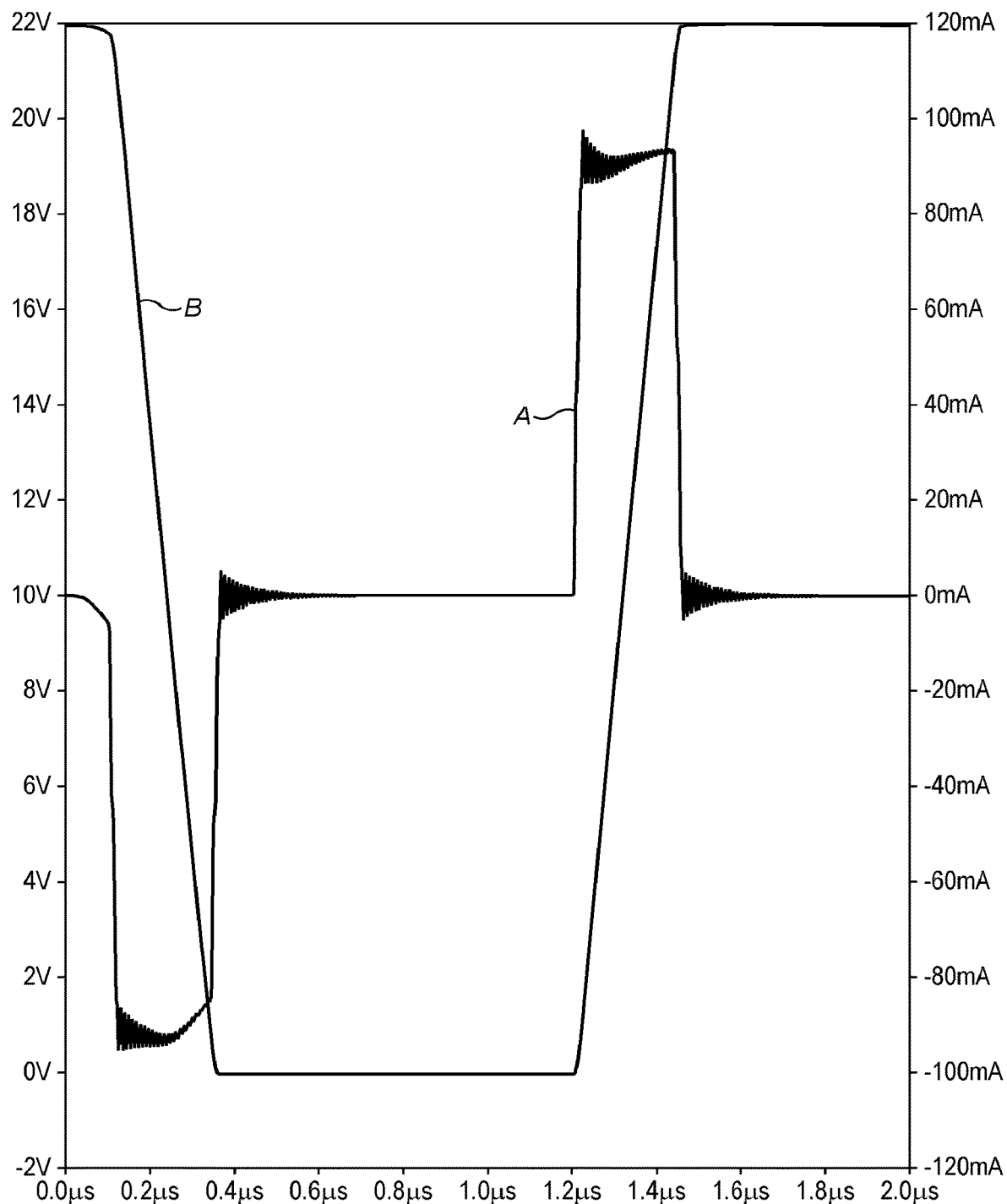

FIGS. 7a and 7b illustrate plots for a current driven printhead actuator circuit of the type shown in FIGS. 4 and 5. In each figure, plot A is the current of the drive waveform input to the variable capacitive load, and plot B is the voltage across the variable capacitive load. The capacitive load on FIG. 7a is 40 nF. The capacitive load on FIG. 7b is 1 nF. For FIG. 7a, the rate of change of voltage with time is constant over the transition from Vhigh to Vlow. The rate of change of voltage with time is also constant over the transition from Vlow to Vhigh. There is no roll off at the ends of the transitions of the type visible in FIGS. 3a and 3b. There is no overshoot above the desired Vhigh and no undershoot below the desired Vlow. The voltage signal does not exhibit any ringing. For FIG. 7b, the transitions between the voltage levels are also highly linear. The slew rate is the same for the 1 nF load as it is for the 40 nF load. There is no overshoot above the desired Vhigh and no undershoot below the desired Vlow. The voltage signal does not exhibit any ringing. There is a small roll off at the start of the transition from Vhigh to Vlow as the turn off time of the current source is slower at very low currents. The digital control circuit could peak the digital drive signal to form a peak in the analogue drive signal in order to prevent the identified roll off. In both cases, the current of the drive waveform input to the variable capacitive load is a square wave. A negative square wave causes the voltage transition from Vhigh to Vlow. A positive square wave causes the voltage transition from Vlow to Vhigh. The digital control circuit dynamically modifies the digital current drive signal to match the variable capacitive load of the print cycle by changing the amplitude of the square wave and/or the time period for which the current is at its maximum amplitude. In this way, the printhead actuators are driven with a drive waveform which is optimised for the capacitive load of that print cycle.

Figure 8:
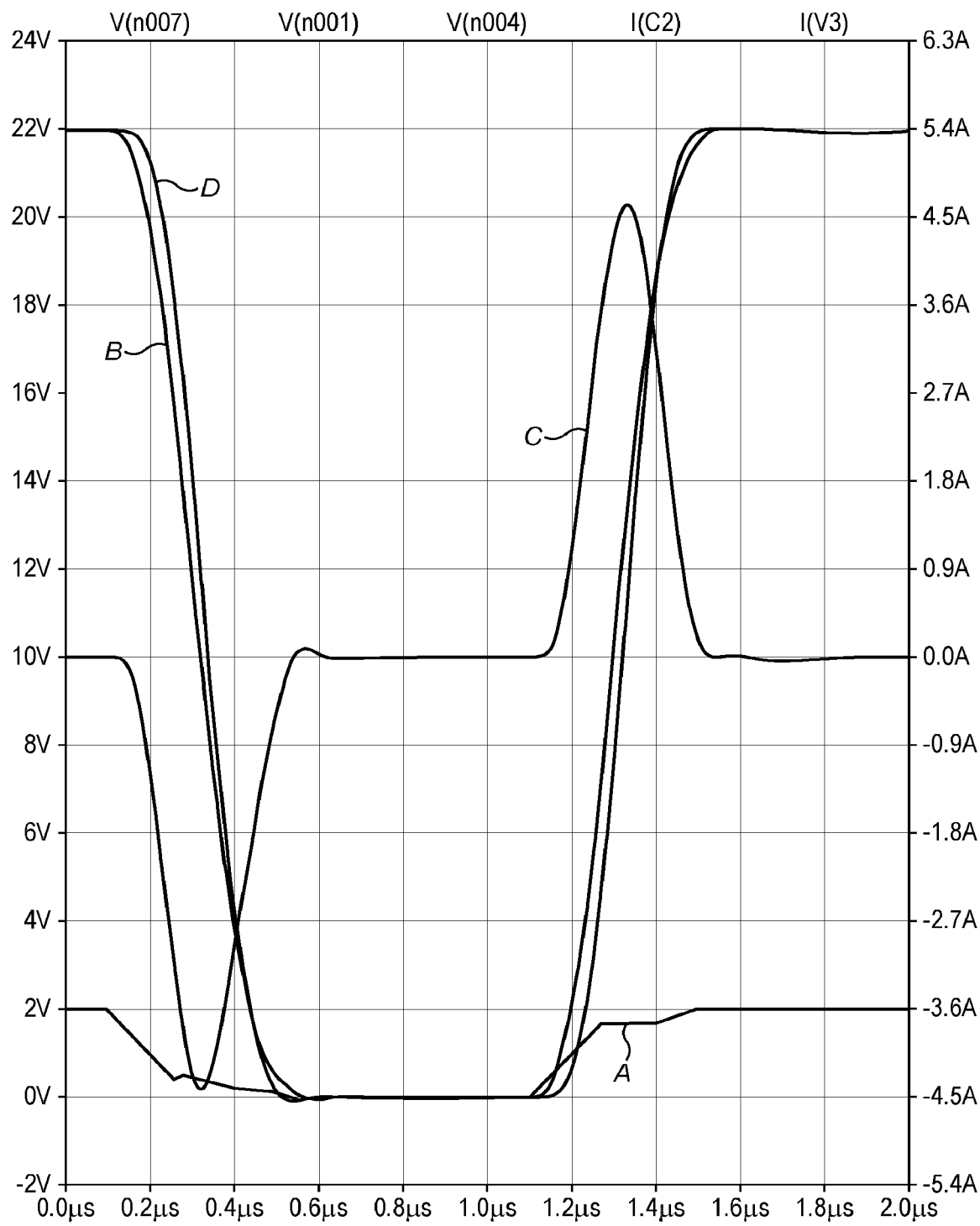
FIG. 8 illustrates a plot for a charging cycle of a voltage driven printhead actuator circuit of the type shown in FIG. 6.
Figure 9:
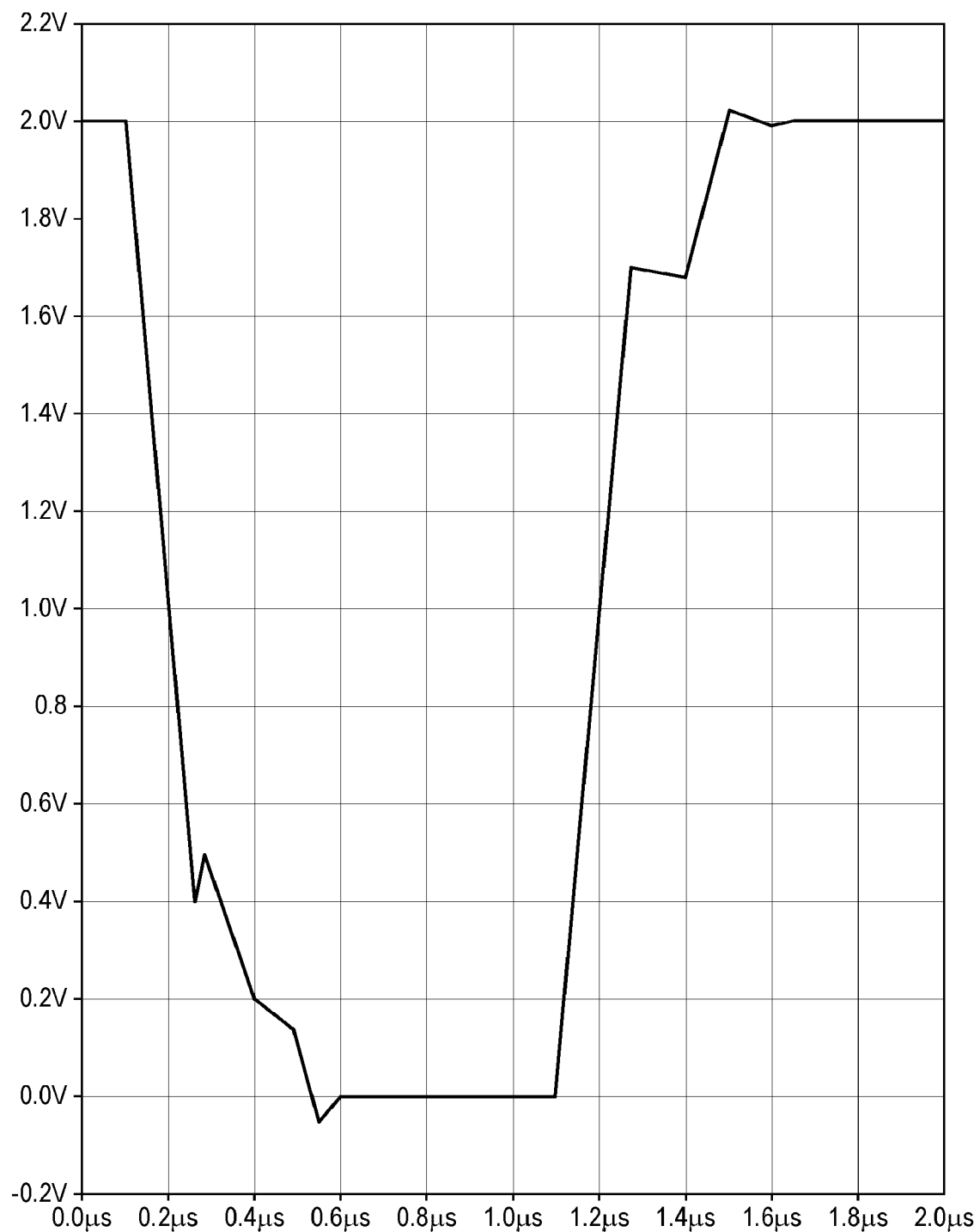
FIG. 9 illustrates an enlarged view of the amplifier drive waveform of FIG. 8.

FIG. 8 illustrates a plot for a voltage driven printhead actuator circuit of the type shown in FIG. 6. Plot A is the drive signal input to the voltage amplifier 626, plot B is the analogue drive signal output from the drive circuit, plot C is the current of the drive waveform input to the variable capacitive load, and plot D is the voltage across the variable capacitive load. The capacitive load on FIG. 8 is 40 nF. By comparison with FIG. 3b, it can be seen that the drive signal input to the amplifier drive waveform has been distorted. FIG. 9 illustrates an enlarged view of the distorted amplifier drive waveform. The amplifier drive waveform has been distorted to optimise it to prevent overshooting of Vhigh and undershooting of Vlow. The voltage across the capacitive load shown in FIG. 8 on plot D does not exhibit the overshooting and undershooting which can be seen in plot D of FIG. 3b. Further distortion could be applied to optimise the linearity of the voltage transitions of pot D of FIG. 8.

In both the current driven and voltage driven circuits, the digital control circuit receives or generates pixel data for the printing cycles. Thus, the number of printhead actuators active in each print cycle is known by the digital control circuit. The digital control circuit provides the pixel data to the cold switch ASIC. The digital control circuit modifies the digital drive signal dependent on the determined capacitance of the active printhead actuators for that print cycle.

The capacitance of the active printhead actuators for that print cycle may be predetermined. For example, the digital control circuit may receive an indication of the predetermined capacitance of the variable capacitive load for that printing cycle. Alternatively, the digital control circuit may store capacitance values for the printhead actuators, and determine the capacitance for a printing cycle based on the number of active printhead actuators and the stored capacitance values. The digital control circuit may store only one nominal capacitance for a printhead actuator, and determine the capacitance in a printing cycle to be the nominal capacitance multiplied by the number of printhead actuators active in the printing cycle. Alternatively, the digital control circuit may store a nominal capacitance for each individual printhead actuator, or for a group of printhead actuators, and determine the capacitance in a printing cycle to be the summation of the nominal capacitances of the printhead actuators active in the printing cycle. The nominal capacitances may have been determined from production sampling or design analysis.

The capacitance of a capacitive load is temperature dependent. A temperature sensor (not shown) may measure the temperature of the printhead actuators, and feed this temperature measurement back to the digital control circuit. The digital control circuit may then modify the predetermined capacitance of the active printhead actuators in the printing cycle according to a stored capacitance-temperature relationship. Alternatively, the digital control circuit may store a set of values for the nominal capacitance or nominal capacitances of the printhead actuators, each value for a different temperature range. In this case, the digital control circuit selects the nominal capacitances of the set which correspond to the measured temperature.

The capacitance of each printhead actuator or groups of printhead actuators may be determined by direct measurement before the printing operation is initiated. In this case, the digital control circuit stores the measured capacitances, and then determines the capacitance in a printing cycle to be the summation of the measured capacitances of the active printhead actuators in the printing cycle. A temperature sensor may measure the temperature of the printhead actuators, and feed this temperature measurement back to the digital control circuit. The digital control circuit may then modify the capacitance of the active printhead actuators in the printing cycle according to a stored capacitance-temperature relationship. Alternatively, the digital control circuit may, before the printing operation is initiated, measure the capacitance of each printhead actuator or groups of printhead actuators in different temperature ranges, and store a set of values for the capacitances of the printhead actuators, each value for a different temperature range. In this case, the digital control circuit selects the capacitances of the set which correspond to the measured temperature.

The capacitance of each printhead actuator or group of printhead actuators may be determined by direct measurement during the printing operation in between active printing cycles. In this case, the digital control circuit stores the most recent measured capacitances, and then determines the capacitance in a printing cycle to be the summation of the measured capacitances of the active printhead actuators in the printing cycle. No temperature adjustment is necessary in this case, because the temperature of the active printhead actuators of a printing cycle can be assumed to be the same as the temperature of those printhead actuators when their capacitance was measured.

$$I = C\frac{dv}{dt} \qquad \text{(equation 1)}$$

Where I is current, C is capacitance, V is voltage, and t is time.

For a current drive circuit, for each printing cycle, the digital control circuit modifies the current to match the desired rate of change of voltage dv/dt to the determined capacitance for that printing cycle. The current of the drive waveform has a square wave profile, such as that shown in FIGS. 7a and 7b. The current applied by the digital control circuit is directly proportional to the determined capacitance of the variable capacitive load for that printing cycle. If the printhead actuators are treated as each having the same capacitance, then the digital control circuit scales the amplitude of the current of the drive waveform of a printing cycle proportionally to the number of active printhead actuators in that printing cycle. Otherwise, the digital control circuit scales the amplitude of the current of the drive waveform of a printing cycle proportionally to the determined capacitance of the active printhead actuators in that printing cycle. The digital control circuit may also match the width of the current pulses for the printing cycle to the determined capacitance for that printing cycle. The lower the capacitance, the smaller the width of the current pulse. This is to avoid overshooting of Vhigh and undershooting of Vlow. The digital control circuit may also match Vhigh and Vlow to the determined capacitance for that printing cycle.

For a voltage drive circuit, for each printing cycle, the digital control circuit modifies the digital voltage drive signal to distort the analogue drive signal so as to cause the drive waveform to match the desired rate of change of voltage dv/dt to the determined capacitance for that printing cycle. The digital control circuit may store a set of modified digital voltage drive signals, each for driving a different range of capacitive loads. The digital control circuit selects the stored modified digital voltage drive signal corresponding to the determined capacitance of the current printing cycle, and applies that selected modified digital voltage drive signal to the drive circuit.

The capacitance of an individual printhead actuator or a group of printhead actuators may be determined as follows. The digital control circuitry sends a control signal to cold switch ASIC. This control signal controls cold switch ASIC to connect the drive waveform to the capacitive load to be measured. The control signal may, for example, cause a FET pass gate in the cold switch ASIC to be turned on which connects the drive waveform to the capacitive load. The capacitive load may be an individual printhead actuator or a group of printhead actuators.

The digital control circuit then generates a test digital drive signal for driving that capacitive load only. The test digital drive signal may be of the same form as a digital drive signal used during printing. The test digital drive signal may have a lower amplitude pulse and/or a lower dv/dt pulse so as to enable the capacitance of the printhead actuator(s) to be determined without causing them to eject ink. The drive circuit converts the test digital drive signal to a test analogue drive signal for charging the capacitive load. The test analogue drive signal morphs to a test drive waveform for charging the capacitive load.

The test drive waveform is sensed and fed back to the digital control circuitry. The sensing may be near end sensing, in which the test analogue drive signal and the return waveform are both sensed at the output of the drive circuit 470,570,670 and 472,572,672. The sensing may alternatively, or additionally, be far end sensing, in which the test drive waveform and the return waveform are both sensed 474,574,674 and 476,576,676 at the printhead actuator bank end of cable 430,530,630.

The sensed signals are digitised. The sensed signals may be digitised using a high speed ADC. FIGS. 4, 5 and 6 illustrate an alternative approach, in which the sensed signals are amplified and repetitively input to a low speed ADC 492,592,692 which receives a clock signal 494,594,694 from digital control circuit 402,502,602. The clock signal is skewed in steps for each waveform pulse generated. For example, the clock signal may be skewed in 100 ps steps. This gives the equivalent time sampling of 10 GHz for the ADC. Thus, for example, for a 2 ms pulse, with a pulse repetition rate of 100 KHz, it would take 20 ms to digitise the entire waveform. The digitised signal is output from the ADC to the digital control circuit.

In the case that both far end sensing and near end sensing are performed, the far end sensed signals may be input 478,578,678 and 480,580,680 to differential amplifier 486, 586,686, and the near end sensed signals may be input 482,582,682 and 484,584,684 to differential amplifier 488, 588,688. The outputs of the two differential amplifiers are input to analogue multiplexor 490,590,690, whose output forms the input to ADC 492,592,692.

Alternatively, a fast oscilloscope may be used to capture the analogue drive signal and/or the drive waveform in a single cycle and provide the captured signals to the digital control circuit.

The digital control circuit measures the rate of change of voltage with time, dv/dt, of either or both of the voltage transitions of the digitised signal. Using equation 1, the known current of the analogue drive signal, and the measured dv/dt, the digital control circuit determines the capacitance of the capacitive load. The digital control circuit may also compare the maximum voltage of the digitised signal to the desired post-charge voltage Vhigh. Similarly, the digital control circuit may compare the minimum voltage of the digitised signal to the desired post-discharge voltage Vlow. The digital control circuit can therefore determine whether the digitised signal overshot Vhigh and/or undershot Vlow. For a current drive circuit, overshooting and undershooting indicate that the current pulse was too wide for the actual capacitance of the capacitive load. The digital control circuit may also determine whether the digitised signal oscillates at the ends of the voltage transitions, i.e. whether there is any signal ringing. Thus, the digital control circuit can determine the current amplitude and the width of the current pulse to apply to drive that capacitive load with the desired dv/dt, and without causing any signal ringing or overshooting of Vhigh or undershooting of Vlow.

The digital control circuit may carry out the testing described above at a range of different temperatures. In this way, the digital control circuit determines the capacitance of the capacitive loads in different temperature ranges. Subsequently, in operation, the digital control circuit may receive the temperature of the printhead actuators, and determine the capacitance of the active printhead actuators to be the sum of the determined capacitances of those printhead actuators in the temperature range which encompasses the measured temperature.

The digital control circuit may carry out the testing described above when the printhead actuators have been active for a range of different time periods. In this way, the digital control circuit determines the capacitance of the capacitive loads in different time period ranges. Subsequently, in operation, the digital control circuit may receive the time period that the printhead actuators have been active for, and determine the capacitance of the active printhead actuators to be the sum of the determined capacitances of those printhead actuators in the time period range which encompasses the measured time period.

For a voltage drive circuit, the digital control circuit compares the digitised signal to an ideal waveform. The digital control circuit computes an error signal to be the difference between the ideal waveform and the digitised signal. Another test digital voltage drive signal is generated which is modified from the last test digital voltage drive signal by deducting the error signal from the last test digital voltage drive signal. This is applied to the drive circuit, sensed, digitised and fed back to the digital control circuit. This process is performed iteratively in order to produce a distorted digital voltage drive signal which is optimised for that capacitive load. The distorted digital voltage drive signal is stored for that capacitive load. The digital control circuit may perform this calibration process for every capacitive load, and store a digital voltage drive signal to use when driving each capacitive load. Alternatively, the digital control circuit may store a set of different distorted digital voltage drive signals, each one of which is used when driving a range of capacitive loads. For example, the set may consist of four or eight distorted digital voltage drive signals which are used to drive a total capacitive load range of 0-40 nF.

The digital control circuit may carry out the testing described above at a range of different temperatures. In this way, the digital control circuit determines an optimised distorted digital voltage drive signal for each of a range of capacitive loads in each of a set of different temperature ranges. Subsequently, in operation, the digital control circuit may receive the measured temperature of the printhead actuators and the capacitive load, and select the distorted digital voltage drive signal to be the one optimised for the capacitive load range that encompasses the capacitive load and the temperature range that encompasses the measured temperature.

The digital control circuit may carry out the testing described above when the printhead actuators have been active for a range of different time periods. In this way, the digital control circuit determines an optimised distorted digital voltage drive signal for each of a range of capacitive loads in each of a set of different time period ranges. Subsequently, in operation, the digital control circuit may receive the time period that the printhead actuators have been active for and the capacitive load, and select the distorted digital voltage drive signal to be the one optimised for the capacitive load range that encompasses the capacitive load and the time period range that encompasses the measured time period.

The testing processes described above may be applied during manufacture of the printhead drive circuit. In this case, predetermined capacitances of each capacitive load are generated, optionally at a range of temperatures and/or time periods. Similarly, predetermined distorted digital voltage drive signals may be generated, optionally optimised for specific capacitance, temperature and/or time period ranges. Alternatively, or in addition, the testing processes may be applied as a startup test for a printer. Thus, the testing is applied when the printhead drive circuit is in an operational configuration but prior to a printing operation occurring. Alternatively, or in addition, the testing processes may be applied during a printing operation in between active printing cycles.

The digital control circuit may perform testing during manufacture, at startup and between active printing cycles of a printing operation. Suitably, the digital control circuit uses the most recent calibration data to determine the modifications to the digital drive signal for each printing cycle to match the current capacitance of the variable capacitive load in order to generate optimised drive waveforms for that printing cycle. The digital control circuit may maintain a log of all the calibration data determined for output to a system analyser. The system analyser uses this data to analyse the condition of the bank of printhead actuators, and determine whether maintenance and/or replacement of the printhead actuators is needed for improved operation.

The printhead drive circuit may further comprise circuitry for preventing overshoot of Vhigh and undershoot of Vlow during active print cycles. Comparator 498, 598, 698 receives an indication of the drive waveform voltage. The comparator may receive the amplified drive waveform and return waveform which are sensed at the printhead actuator end of cable 474,574,674 and 476,576,676. Alternatively, or additionally, the comparator may receive the amplified analogue drive signal and return waveform which are sensed at the output of the drive circuit 470,570,670 and 472,572,672. DAC 466,566,666 receives a threshold voltage from the digital control circuit which it converts to an analogue threshold voltage which is input to comparator 398,598,698. The comparator compares the indication of the drive waveform voltage to the threshold voltage. The output of the comparator is input to the digital control circuit. The comparator output changes state when the indication of the drive waveform voltage crosses the threshold voltage. When the comparator changes state, the digital control circuit responds by stopping output of the digital drive signal to the drive circuit. The digital control circuit may, in response to the comparator changing state, stop generating the digital drive signal.

Figure 10:
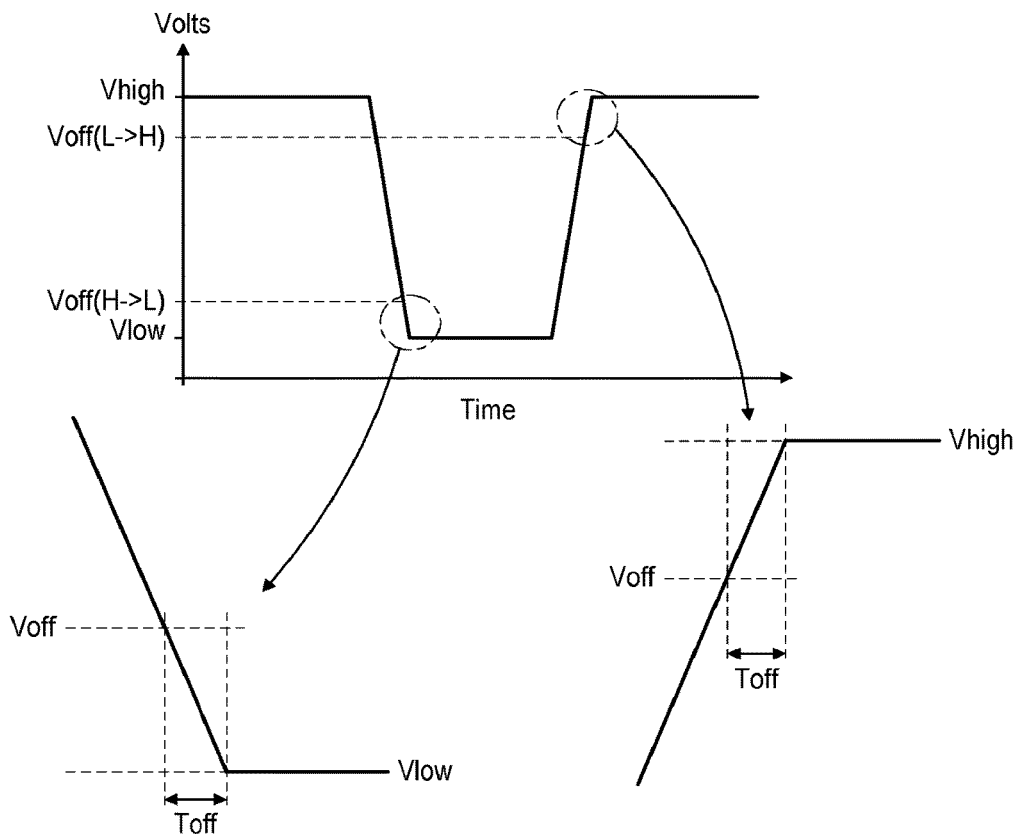
FIG. 10 illustrates the threshold voltages of a comparator used to disable the drive signal of the drive circuit.

The digital control circuit generates the threshold voltage applied to the comparator. The digital control circuit changes the threshold voltage dependent on whether the capacitive load is being charged or discharged. The drive circuit has a non-negligible turn off time. Thus, the digital control circuit generates the threshold voltage during charging such that the maximum voltage of the drive waveform is Vhigh. Similarly, the digital control circuit generates the threshold voltage during discharging such that the minimum voltage of the drive waveform is Vlow. The time taken for the drive circuit to turn off, Toff, is measured in advance and known to the digital control circuit. For example, Toff may be in the range 10-20 ns. Since the slew rate of the drive circuits described herein is known and highly linear, the digital control circuit can accurately determine the threshold voltage Voff using Vhigh or Vlow, Toff and the known dv/dt. FIG. 10 illustrates that the threshold voltage Voff is chosen for the low to high voltage transition such that a time Toff after the digital drive signal has been disabled, the drive waveform reaches its maximum voltage of Vhigh. Similarly, FIG. 10 illustrates that the threshold Voff is chosen for the high to low voltage transition such that a time Toff after the digital drive signal has been disabled, the drive waveform reaches its minimum voltage of Vlow.

The use of the comparator ensures that the digital drive signal during active printing cycles of the printhead drive circuit does not overshoot Vhigh and/or undershoot Vlow even if the characteristics of the printhead actuators have changed since the last calibration occurred, for example as a result of temperature changes. These changes cause the capacitance of the capacitive load and the slew rate dv/dt of the changing voltage component of the drive waveform to be different to that expected by the digital control circuit.

The digital control circuit may detect the elapsed time in each printing cycle at which the comparator changes state. The digital control circuit may detect the temperature of the variable capacitive load in each printing cycle at which the comparator changes state. The digital control circuit may adjust the detected elapsed time for the detected temperature to form an adjusted detected elapsed time at which the comparator changes state. The digital control circuit may then compare the adjusted detected elapsed time to a threshold elapsed time. If the adjusted detected elapsed time is outside of the threshold elapsed time, the digital control circuit may determine that a fault has been detected. This fault may be, for example, that the printhead actuator has short circuited or got stuck open.

The slew rate dv/dt of the rising and falling edges of the drive waveform affects the resultant ink ejection velocity and hence the pixel placement accuracy of the resultant printed image. Both the current driven and voltage driven printhead actuator driving circuits and methods described herein provide a drive waveform having a highly linear slew rate of the desired magnitude in the drive waveform for a printing cycle which is independent of the number of printhead actuators active in that printing cycle. This enables the active printhead actuators to eject the desired volume of ink at the precise velocity desired independent of the number of other printhead actuators active in the printing cycle.

If the voltage of the drive waveform undershoots Vlow and/or overshoots Vhigh, this changes the total applied voltage to the printhead actuators which affects the volume of ink ejected from the printhead actuators and hence changes the darkness of the printed pixel. If the printhead actuator characteristics change between calibration and an active printing cycle, the comparator described herein prevents the undershoot/overshoot problem during the active printing cycle by switching the digital drive signal off to prevent the undershoot/overshoot of the drive waveform.

The printhead actuator driving circuits described herein improve the mean time between failing (MTBF) of the printhead actuators by avoiding the stress to the printhead actuators which is caused by ringing of the drive waveform.

Undershooting of Vlow can lead to a negative drive waveform which can latch up and damage the cold switch silicon. The printhead actuator driving circuits described herein improve the mean time between failing (MTBF) of the cold switch silicon by avoiding undershooting of Vlow.

The current drive system described herein minimises power dissipated within the drive circuitry because high power is only dissipated when the drive circuit is slewing its output signal between high and low voltages.

By optimising the drive waveform to the capacitive load of the current printing cycle, longer cables can be used between the drive circuit and the bank of printhead actuators and still enable acceptable printing quality to be achieved.

Capacitor 438,538,638 reduces the dynamic range of the capacitive load driven. For example, it might reduce it from 400:1 (40 nF to 100 pF) to 40:1 (40 nF to 1 nF). This enables easier optimisation of the drive circuit for the full range of capacitive loads.

In the following example, the circuitry of FIG. 1 is used in electro discharge machining (EDM). In this example, a variable capacitor is discharged over a spark gap between an electrode and a workpiece.

Figure 11:
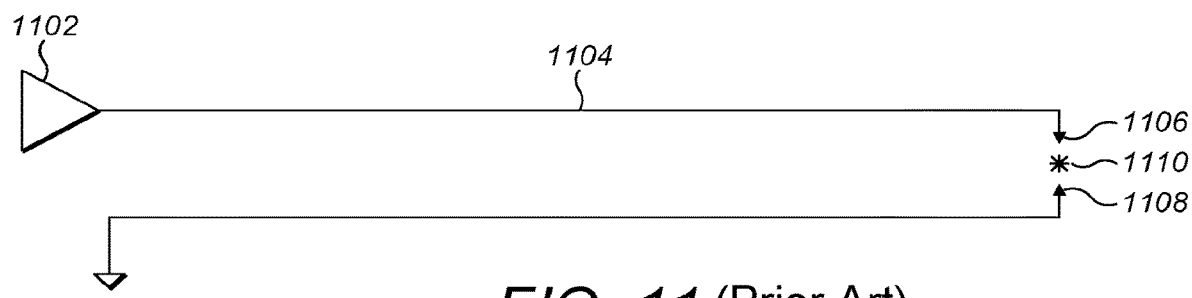
FIG. 11 illustrates a known EDM arrangement.

FIG. 11 illustrates a known EDM arrangement. A switched voltage driver 1102 generates a fast risetime pulse which propagates along cable 1104 from the switched voltage driver 1102 to electrode 1106. Electrode 1106 is separated from workpiece 1108 by spark gap 1110. The cable 1104 is typically long (in electrical wavelength terms, relative to the risetime of the pulse, which could be of the order of a few to tens of nanoseconds) and generally has a poorly defined impedance. The impedance of the spark gap 1110 changes with electrode/workpiece geometry, which results in further mismatch of the source impedance to the load.

As shown in FIG. 11, a square drive signal pulse is output from switched voltage driver 1102. This signal is distorted by reflections along the cable 1104. The resulting drive waveform at the electrode 1106 has a poorly defined dv/dt on its rising edge and ringing/overshoot. Thus, the dv/dt of the drive waveform pulse as it is applied across the spark gap can be anywhere between the maximum possible that the switched voltage driver can generate and zero or negative when the signal is ringing.

The voltage at which the spark gap 1110 ionises is used by the control system to derive the physical size of the spark gap. The ionisation voltage depends on:
 1) the dielectric strength of the insulating dielectric fluid between the electrode and workpiece;
 2) the shape of the electrode and workpiece (sharp points promote lower ionisation voltages, planes and arcs, higher voltages);
 3) the material of the electrode and workpiece; and
 4) the dv/dt of the applied ionisation voltage.

Because the dv/dt of known systems is highly variable, the spark gap size determined is inaccurate.

It is known to minimise cable lengths and optimise cable types to reduce inductance and reduce impedances. However, the far end impedance changes with capacitive loading. Also, in order for the power supply to be able to produce short pulses for low energy microEDM or fine finishing, the rise time has to be very short. This creates ringing and reflections as high frequency signals at significant power are transmitted along cables that are not of the correct impedance to match the switched voltage drive to the load. Producing short pulses for finishing/micro work results in signals with inconsistent and unknown dv/dt, which adversely affects the derivation of the spark gap size and hence, reduces the accuracy of the resultant parts under all machining conditions.

MicroEDM power supplies have been made with R/C circuits to try to control the dv/dt and achieve more accurate results. Such circuits do reduce the dv/dt, so the ringing due to reflections is reduced, but they still suffer from varying dv/dt during the pulse risetime, and hence, are unable to derive the spark gap accurately.

The ringing and uncertainty in dv/dt at the point of ionization can be mitigated in modern systems by averaging the spark over voltage. This reduces the variability of the spark gap size calculation, but does not increase its accuracy.

Figure 12:
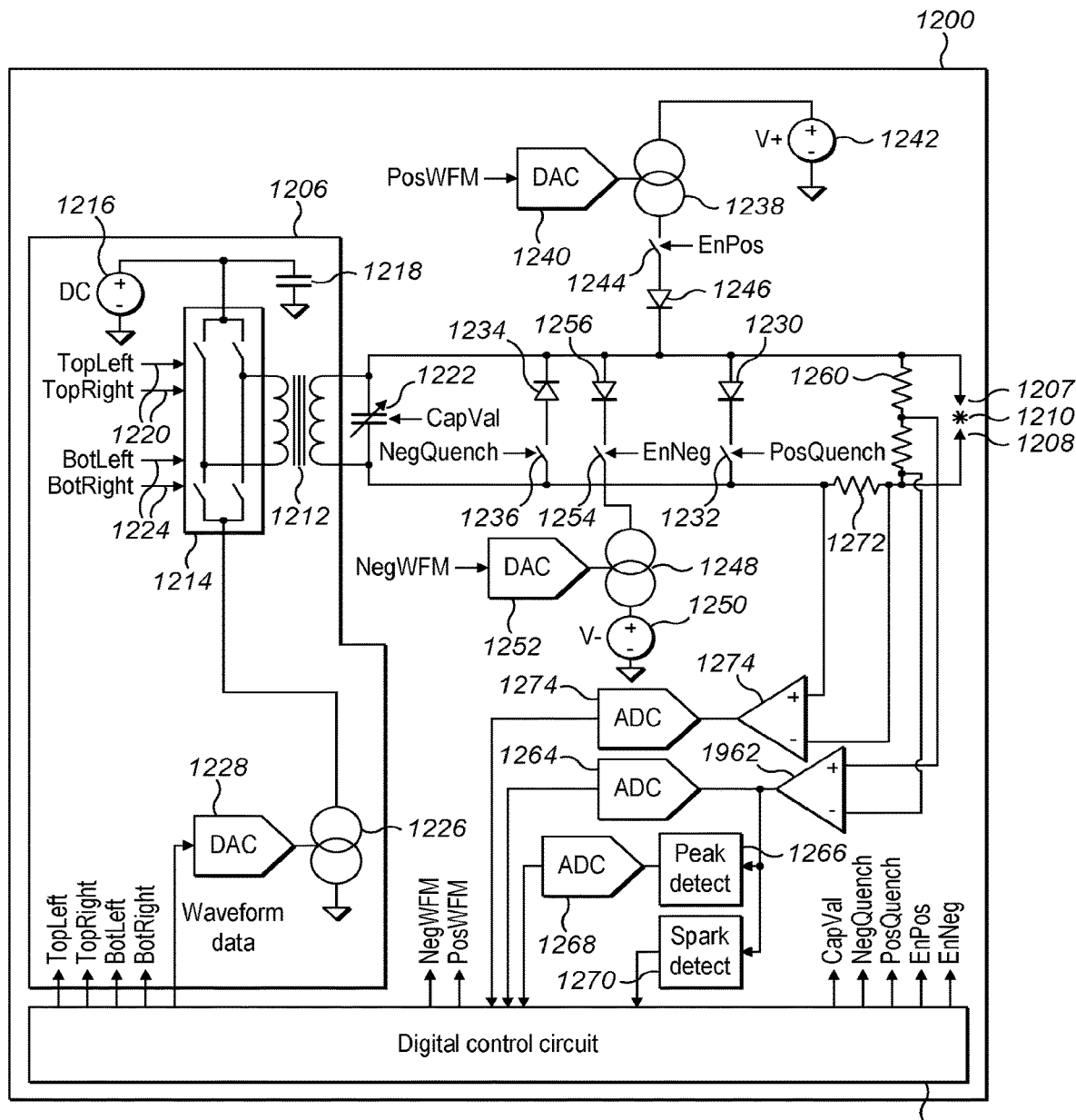
FIG. 12 illustrates an EDM drive circuit.

FIG. 12 illustrates a first exemplary current drive circuit 1200 for driving an EDM process. Charging of variable capacitor 1222 is driven by drive circuit 1206 under the control of digital control circuit 1202. Variable capacitor 1222 discharges providing its stored energy to spark gap 1210 via electrode 1207. This ionizes spark gap 1210 which causes a portion of the workpiece 1208 to vaporize. Multiple charging cycles are used to produce a set of energy pulses at spark gap 1210. Thus, the workpiece 1208 is gradually eroded to form a desired shape.

Drive circuit 1206 comprises a transformer 1212 driven by a DC supply 1216 and current source 1226 via a H-bridge 1214. Transformer 1212 has a single turn primary which is connected across H-bridge 1214. The transformer 1212 may be a high frequency, low leakage inductance pulse transformer. Single polarity DC supply 1216 is connected to the transformer 1212 through the H-bridge 1214. H-bridge 1214 allows the single turn primary to be alternately driven positive and negative with the single polarity DC supply 1216. Digital control circuit 1202 outputs gate drive signals 1220 to the H-bridge 1214 which cause the H-bridge to switch alternately positive and negative current through to the transformer. Capacitor bank 1218 decouple the DC supply 1216 such that very low impedance is presented to the top of the H-bridge regardless of the switching frequency of the H-bridge.

Figure 13A:
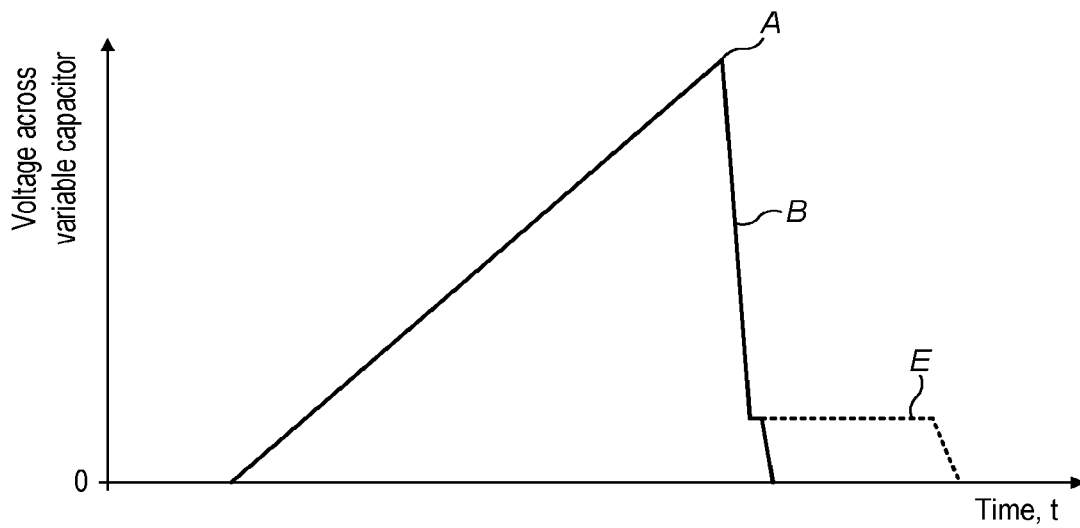
FIGS. 13a, 13b and 13c illustrate plots for charging cycles of the EDM drive circuit.
Figure 13B:
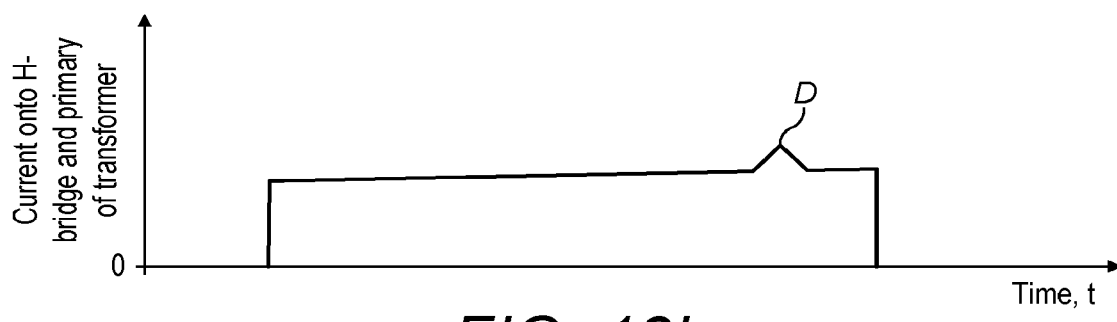

The digital control circuit applies a digital drive signal to DAC 1228. DAC 1228 drives current source 1226. Current source 1226 is connected to transformer 1212 through the H-bridge 1214. Digital control circuit 1202 outputs gate drive signals 1224 to H-bridge 1214 which cause the H-bridge to switch current from current source 1226 through to the transformer. The digital control signal modifies the digital drive signal to DAC 1228 for each charging cycle to match the voltage ramp rate dv/dt of the drive waveform at the variable capacitor 1222 to the capacitance of the variable capacitor 1222 in that charging cycle. Current from current source 1226 flows into the primary of transformer 1212. The DAC 1228 generates dv/dt such that the DC current needed to charge the variable capacitor 1222 and the magnetising current of the transformer 1212 is sunk through the transformer primary. The current flowing through the transformer primary causes current to flow through the transformer secondary, thereby charging variable capacitor 1222. FIG. 13b illustrates the current into the primary of the transformer 1212. The current is the sum of the constant charge current plus the increasing magnetising current for the transformer. The rate of increase of the magnetising current is dependent on the inductance of the transformer primary and may be determined prior to operation of the EDM operation and stored in the digital control circuit.

Figure 13C:
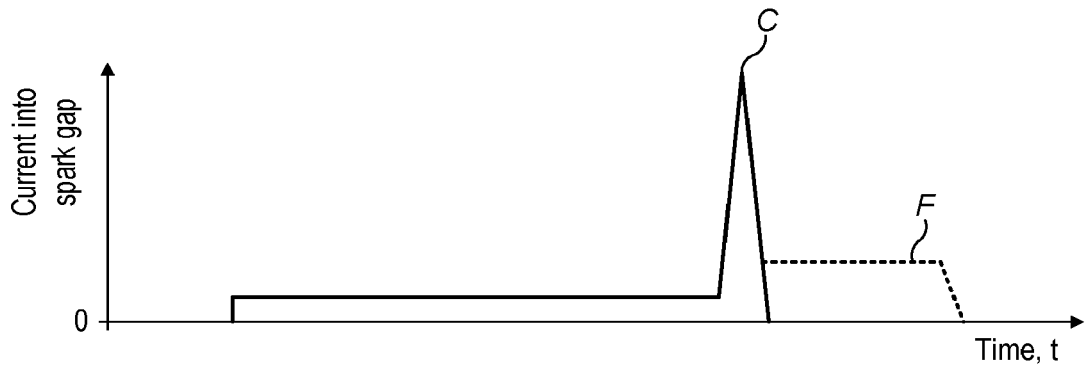

The spark gap 1210 is connected in parallel with the variable capacitor 1222. FIG. 13a illustrates the voltage across the variable capacitor 1222, and hence the voltage across the spark gap 1210. The spark gap voltage rises as the variable capacitor 1212 is charged until the gap ionises at the point marked A on FIG. 13a. At this point, a rapid decay in the spark gap resistance will result in the variable capacitor 1222 being discharged rapidly. The voltage across the spark gap rapidly drops, marked B on FIG. 13a. FIG. 13c shows the current into the spark gap. As the variable capacitor 1222 is charged, the current into the spark gap 1210 remains constant. When the spark gap ionises, the variable capacitor 1222 discharges rapidly into the spark gap plasma, which causes a peak in the spark gap current, marked C on FIG. 13c. This may cause a small peak in the current in the primary of the transformer, marked D on FIG. 13b, due to a lag in the current source 1226 responding to the ionisation.

During ionisation, a plasma channel forms between the electrode and workpiece. Where the plasma enters the workpiece, material is melted due to the high power density. This forms a crater. The size of the crater depends on the amount of energy that is dissipated in the plasma channel.

As the current starts to flow from the variable capacitor 1222 through the spark gap 1210, it also flows through the transformer secondary. This current that is in excess of the charge current of the capacitor 1222 depletes the flux in the transformer core rapidly. This causes the transformer to stop delivering energy to its secondary. It may take 1-2 ns for this to happen. By virtue of this, the current driven transformer described is capable of delivering pulses of very low energy compared to standard transformers. Standard transformers store considerable energy in their leakage inductance. When the spark gap ionises, the impedance on its secondary is transformed to its primary by the square of the ratio of the number of turns on the primary and secondary coils. This causes the primary to have very low impedance, which pulls the dc current from the low source impedance voltage drive on the primary, and also causes any stored energy on the primary (such as is stored in the decoupling capacitors) to be delivered to the secondary. Thus, the secondary effectively shorts out. For this reason, previous voltage driven transformers do not deliver well controlled low energy levels.

The transformer pulse power supply of FIG. 12 generates charging pulses which are alternately positive and negative. This ensures that the core does not saturate with gradually increasing magnetic flux (by reversing the polarity, the flux is reset on each reversal). However, some EDM operations require either positive or negative only pulses (and some use both). For applications where unipolar pulses are required, the EDM drive circuit 1200 further comprises a quench diode connected in parallel with the variable capacitor 1222. This quench diode quenches the alternate flux reset cycles where the transformer flux is reset by reversing the polarity. In this way no pulse is generated on the transformer secondary during the alternate flux reset cycles. FIG. 12 illustrates a positive quench diode 1230 connected in parallel with the variable capacitor 1222. This positive quench diode is switched into the circuit by switch 1232 under the control of digital control circuit. FIG. 12 also illustrates a negative quench diode 1234 connected in parallel with the variable capacitor 1222. This negative quench diode is switched into the circuit by switch 1236 under the control of digital control circuit.

For rough machining with very large pulse energies (for example above 5 mJ), the EDM drive circuit 1200 may optionally further comprise auxiliary current sources. These auxiliary current sources drive current into the spark gap 1210 once it has ionized and the variable capacitor 1222 has discharged. This enables more energy to be supplied to the spark gap 1210 than that stored in the variable capacitor 1222. This is illustrated in FIGS. 13a and 13c where it can be seen that the current through the spark gap and the voltage across the spark gap remain at elevated values at points E and F after ionisation compared to their pre-charge values. FIG. 12 illustrates a current source 1238 which is connected to supply 1242 and driven by DAC 1240 under the control of the digital control circuit 1202. The current source 1238 is coupled to the spark gap 1210 by FET switch 1244 and diode 1246. FET switch 1246 operates under the control of the digital control circuit 1202. The digital control circuit 1202 causes a positive pulse to be applied to the spark gap 1210 by driving the FET switch 1246 ON for positive cycles and driving the DAC 1240 with a DC value or a profiled waveform for the current profile to be driven into the spark gap.

FIG. 12 also illustrates a current sink 1248 which is connected to supply 1250 and driven by DAC 1252 under the control of the digital control circuit 1202. The current sink 1248 is coupled to the spark gap 1210 by FET switch 1254 and diode 1256. FET switch 1254 operates under the control of the digital control circuit 1202. The digital control circuit 1202 causes a negative pulse to be applied to the spark gap 1210 by driving the FET switch 1254 ON for negative cycles and driving the DAC 1252 with a DC value or a profiled waveform for the current profile to be driven into the spark gap.

Figure 14A:
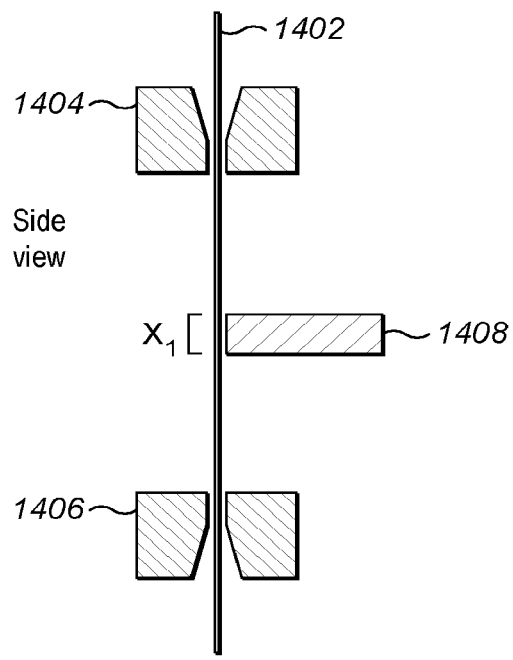
FIGS. 14a, 14b and 14c illustrate variations in spark gap capacitances due to workpiece geometry.
Figure 14B:
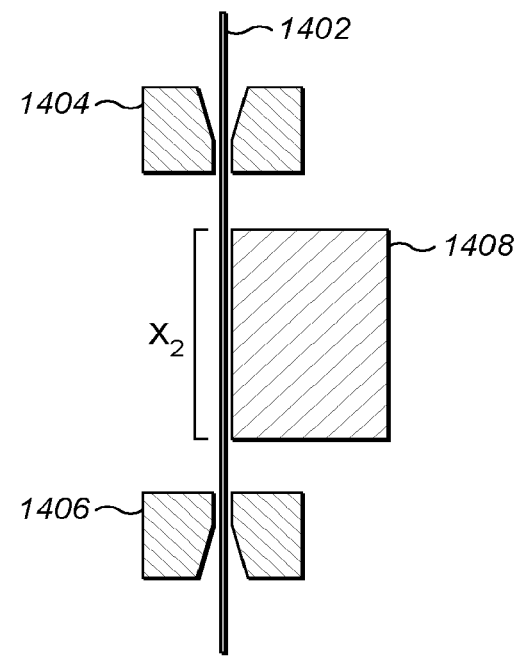
Figure 14C:
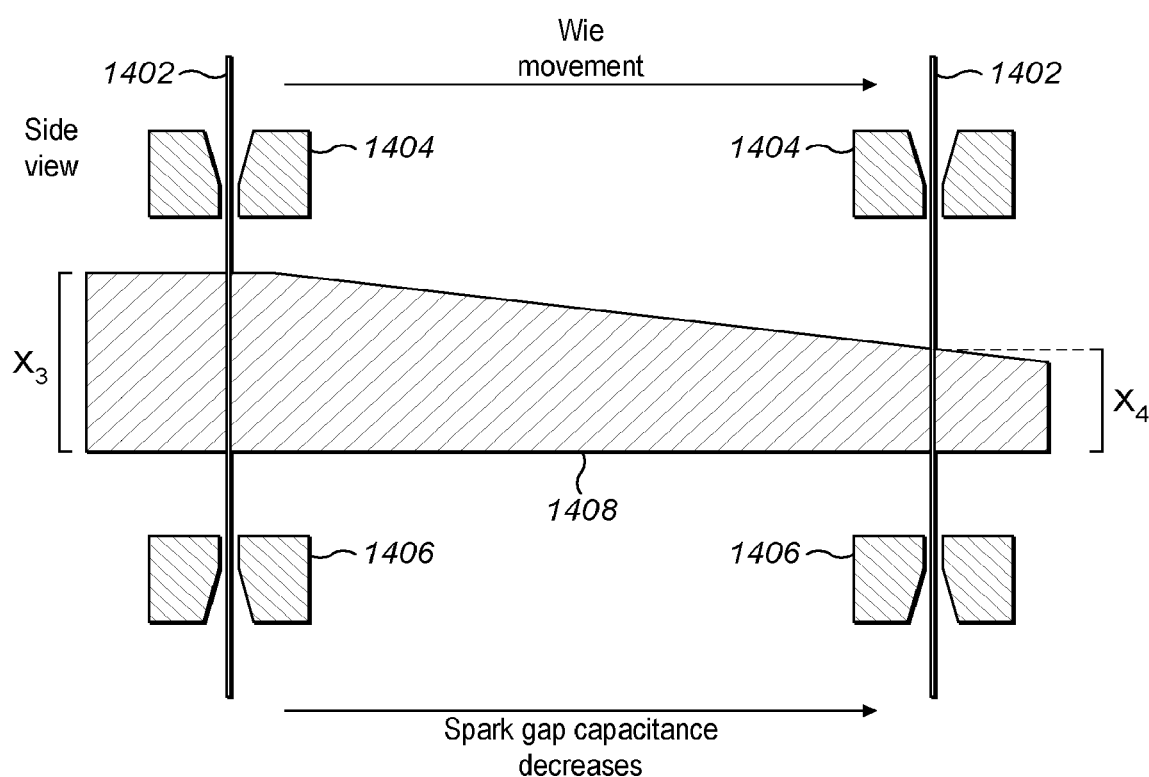

The capacitance of the spark gap 1210 varies with the workpiece geometry. FIGS. 14a, 14b and 14c illustrate this for wire EDM (w-EDM). These figures illustrate a side view in which wire 1402 is guided by wire guide dies 1404 and 1406 and erodes workpiece 1408. The capacitance of the spark gap increases as the length of the wire that is in close proximity to the workpiece increases. In both FIGS. 14a and 14b, the wire approaches the workpiece from free space. In FIG. 14b, the length of wire in close proximity to the workpiece is x2. In FIG. 14a, the length of wire in close proximity to the workpiece is x1. x2>x1, therefore the capacitance of the spark gap in FIG. 14b is greater than that in FIG. 14a. In FIG. 14c, the wire is surrounded by material as it plunges through the solid material of the workpiece. As the wire moves from the left hand side to the right hand side of FIG. 14c, the overlap between the wire and the workpiece decreases, and hence the capacitance of the spark gap decreases during the machining process.

Figure 15A:
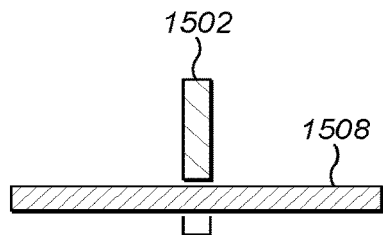
FIGS. 15a, 15b, 15c, 15d, 15e, 15f and 15g illustrate variations in spark gap capacitances due to workpiece geometry.
Figure 15B:
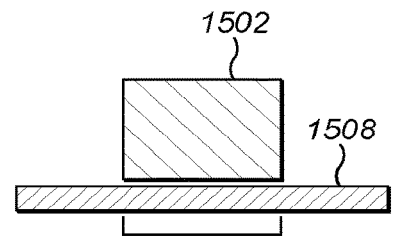
Figure 15C:
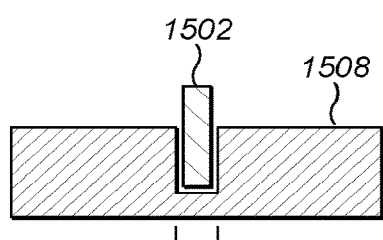
Figure 15D:
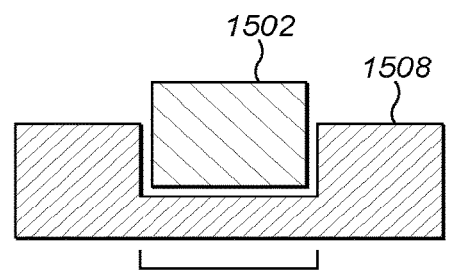
Figure 15E:
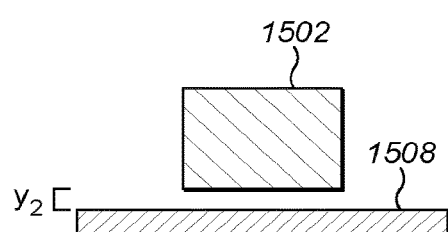
Figure 15F:
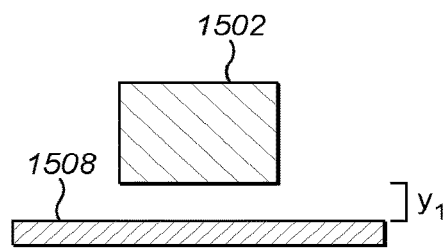
Figure 15G:
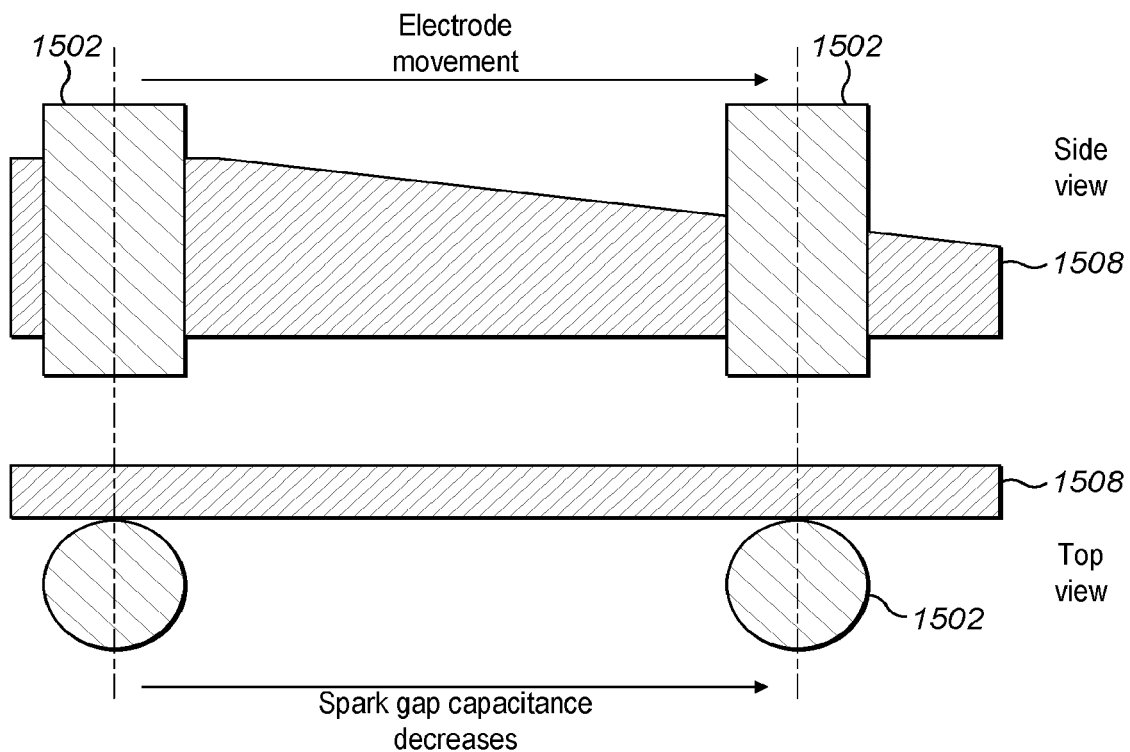

FIGS. 15a-g illustrate how the spark gap 1210 varies with workpiece geometry for plunge erosion. FIGS. 15e and 15f illustrate that as the separation between the electrode 1502 and the workpiece 1508 is reduced, the spark gap capacitance increases. In FIG. 15b, the area of the electrode 1502 in close proximity to the workpiece 1508 is greater than for FIG. 15a, and hence the spark gap capacitance of FIG. 15b is greater than that for FIG. 15a. In figure the electrode of FIG. 15a has plunged into workpiece 1508. Similarly, in FIG. 15d, the electrode of FIG. 15b has plunged into workpiece 1508. The capacitance of the spark gap when the electrode plunges into the workpiece is greater than when it is approaching the workpiece. FIG. 15g shows an electrode 1502 approaching the side of a workpiece 1508 that is tapered. It can be seen that as the electrode moves from left to right in FIG. 15g, the spark gap capacitance will reduce due to the smaller area of contact. As in the w-EDM example above, this effect is more pronounced when the electrode is ploughed through solid material and most of the periphery of the electrode is in close proximity to the workpiece.

The workpiece geometry is known. Changes to the surface area between the electrode and the workpiece as the machining process occurs may be modelled in advance. Thus, the digital control circuit 1202 may be provided with predetermined capacitances of the spark gap for each charging cycle in accordance with the known and changing workpiece geometry. The digital control circuit then modifies the digital drive signal applied to the DAC 1228 in order match the slew rate of the voltage of the rising edge of the EDM pulse to the capacitance of the spark gap in that charging cycle. In this way, the digital control circuit 1202 maintains a constant slew rate dv/dt of the drive waveform whilst charging the variable capacitor 1222.

During operation, as the capacitance of the spark gap increases, the size of the variable capacitor 1222 is reduced under the control of digital control circuit 1202, such that the total capacitance is regulated. This ensures that the dv/dt of the drive waveform remains constant and thus that the energy in each EDM pulse is constant, and hence that the surface finish of the workpiece remains constant.

The digital control circuit 1202 may modify the digital drive signal to DAC 1228 for each charging cycle of the variable capacitor 1222 in accordance with a predetermined capacitance of the spark gap for that charging cycle as described above.

The EDM drive circuit 1200 may further comprise a feedback circuit. Voltage feedback may be accomplished with a potential divider 1260 connected in parallel with the variable capacitor 1222. The output of the potential divider 1260 is input to a differential amplifier 1262. The output of differential amplifier 1262 is input to ADC 1264. ADC 1264 samples the voltage signal and outputs the sampled signal to digital control circuit 1202. The output of differential amplifier 1262 is input to peak detector circuit 1266 and spark detector circuit 1270. Spark detector circuit 1270 detects a spark when it detects a negative dv/dt. This signifies that the spark gap has been ionized. The output of peak detector circuit 1266 is input to ADC 1268. ADC 1268 samples the voltage signal when a spark is detected by the spark detector circuit. ADC 1268 outputs the sampled signal to digital control circuit 1202. Spark detector circuit 1270 outputs to digital control circuit 1202.

Current feedback may be accomplished with a sense resistor 1272 connected in series between the variable capacitor 1222 and the spark gap 1210. Alternatively, current feedback may be accomplished with an RF current transformer. The signal at either side of the sense resistor 1272 is fed to differential amplifier 1274. Differential amplifier 1274 amplifies the current signal and outputs the amplified signal to ADC 1276. ADC 1276 samples the current signal and outputs the sampled signal to digital control circuit 1202.

An alternative to the spark detector circuit 1270 is to sample the output of the differential amplifier 1274 with a comparator set to a threshold just above the charging current of the spark gap. This comparator will then trigger when the spark gap ionizes and the current into the gap increases rapidly.

The digital control circuit determines the rate of change of voltage with time of the sensed signals during charging of the variable capacitor. Using equation 1, the digital control circuit determines the capacitance of the variable capacitive load in the charging cycle measured. The digital control circuit modifies the digital drive signal to the DAC 1228 in dependence on the determined capacitance and the measured dv/dt. The digital control circuit fine tunes the incident edge dv/dt of the drive waveform. This enables the digital control circuit to compensate for changes in capacitance of the spark gap. It also enables the digital control circuit to compensate for other undefined changes such as changes in the dielectric constant of the insulting dielectric and unexpected differences in workpiece geometry. The digital control circuit may determine the capacitance of the spark gap on each charging cycle, and use this capacitance to modify the digital drive signal of the next charging cycle in order to modify the current of the analogue drive signal output from the drive circuit.

On detecting a spark at the spark detection circuit 1270, the digital control circuit 1202 may stop outputting the digital drive signal to the drive circuit 1206. Alternatively, or in addition, the digital control circuit 1202 may control an auxiliary current source, such as current source 1238 or current source 1248 to turn ON in order to cause a longer and/or higher power drive waveform pulse to be applied to the spark gap.

The digital control circuit may output the sensed signals to a system analyser. The system analyser may analyse the sensed signals so as to categorise the pulse type of each charging cycle. Exemplary pulse types are: open circuit, shorted, runt (low amplitude pulse) and normal range EDM pulse. The system analyser may detect a fault in the EDM drive circuit dependent on the pulse types detected over an EDM operation. For example, if there are more than a threshold number or percentage of shorted pulse types or runts, the system analyser may determine a fault. This fault may be that the spark gap is too small. This fault may be that the flushing is not adequate. If there are more than a threshold number or percentage of open pulse types, the system analyser may determine a fault. This fault may be that the spark gap is too large.

The digital control circuit 1202 uses the peak voltage detected by the peak detector circuit 1266 to be the ionisation voltage. The digital control circuit 1202 determines the spark gap size from the ionisation voltage. The spark gap size is proportional to the ionisation voltage. FIG. 13 shows that use of an EDM drive circuit of the type described with reference to FIG. 12 results in generation of a drive waveform with a linear slew rate on the rising edge of the ionisation pulse. Since the dv/dt is linear, the spark over voltage measured is a more accurate representation of the spark gap size than the prior art systems described. Since the gap size calculation is more accurate than prior known systems, the digital control circuit maintains the gap size more accurately than those prior systems. This leads to the machined workpiece being more geometrically accurate.

The digital control circuit 1202 may dynamically modify the digital drive signal input to the drive circuit 1206 to cause the drive waveform to deliver the desired pulse energy and discharge voltage to the variable capacitor 1222 and spark gap 1210 according to the capacitance of the spark gap. The capacitance of the spark gap may vary as a result of any one or more of the following parameters: the known electrode and workpiece geometries, the desired spark gap, the desired surface finish, and parasitic capacitances of the system. The digital control circuit 1202 modifies the drive waveform in each charging cycle to ensure a repeatable, known dv/dt is applied across the spark gap in each charging cycle despite changing capacitive load conditions. By applying a linear known dv/dt, the spark gap calculation is more accurate, the surface finish quality of the machined product is better, and the machined product is more geometrically accurate compared to prior known systems.

The EDM circuit 1200 may further comprise circuitry for preventing the voltage across the variable capacitor from overshooting a maximum desired voltage, Vhigh, during a charging cycle. This circuitry ensures that the maximum gap voltage is not exceeded. Should the spark gap not ionise when the maximum desired voltage is applied, the circuitry causes the erosion cycle to be aborted. This circuitry may comprise a comparator (not shown on FIG. 12) which receives the sensed voltage signal from differential amplifier 1262. The digital control circuit 1202 generates a threshold voltage which it outputs to a DAC. The DAC converts the threshold voltage to an analogue threshold voltage which it inputs to the comparator. The comparator compares the sensed voltage signal to the analogue threshold voltage. The output of the comparator changes state when the sensed voltage signal crosses the analogue threshold voltage. The comparator output is input to the digital control circuit 1202. When the comparator changes state, the digital control circuit stops outputting the digital drive signal to the drive circuit 1206. The digital control circuit may, in response to the comparator changing state, stop generating the digital drive signal.

The drive circuit has a non-negligible turn off time, Toff. The digital control circuit generates the threshold voltage in dependence on the known linear slew rate dv/dt, and the turn off time Toff, such that the maximum voltage of the drive waveform is Vhigh. Vhigh may be chosen to be less than the maximum open circuit voltage. This ensures that the ionisation voltage does not exceed the maximum open circuit voltage. When an open circuit occurs, the comparator senses the voltage has exceeded the threshold voltage, and stops the digital control circuit from driving the drive circuit. Thus, the cycle is aborted. This prevents subsequent ionisation of the spark gap from being used in the calculation of the spark gap size.

Figure 16A:
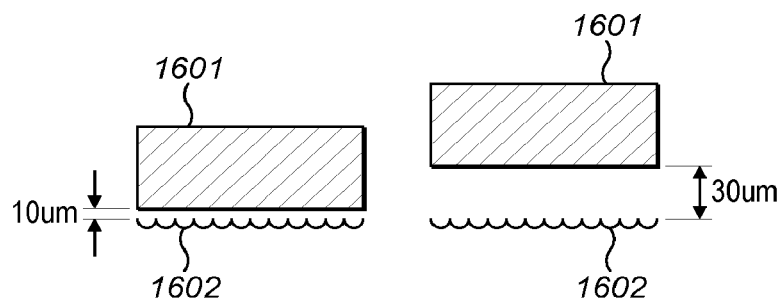
FIGS. 16a and 16b illustrate the surface finish of a workpiece machined using the EDM drive circuit of FIG. 12.
Figure 16B:
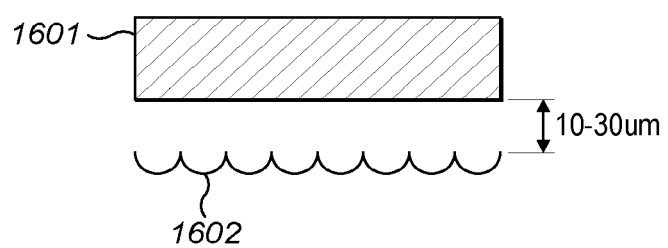

FIGS. 16a and 16b illustrate how the EDM drive circuit of FIG. 12 can operate with the same energy per EDM pulse over very large ranges of spark gap size, and hence, gap capacitance and ionization voltage. Conventional systems, when operating with large spark gaps and large ionization voltages, are unable to operate under these conditions whilst also delivering very low energy per EDM pulse. This is due to the parasitic capacitances in the voltage switching elements.

The EDM drive circuit of FIG. 12 compensates for the variable spark gap capacitance as described above. The high frequency, low leakage inductance pulse transformer stores very little energy and allows a high voltage. These features of the EDM drive circuit enable low energy EDM pulses to be produced.

In FIG. 16a, the electrode 1601 on the left is separated from its workpiece 1602 by a spark gap size of 10 μm. The electrode 1601 on the right is separated from its workpiece 1602 by a spark gap size of 30 μm. Thus, the capacitance of the spark gap is much greater for the setup on the left than the right. The ionisation voltage of the spark gap is much greater for the setup on the right than the setup on the left. However, since the digital control circuit modifies the drive signal to match the time dependent voltage component of the drive waveform to the capacitance of the spark gap in that charging cycle, the slew rate dv/dt of the drive waveform is the same for the machining of both the workpiece on the left and the workpiece on the right. The spark gap ionisation voltage is proportional to the spark gap size. Thus, the same surface finish is achieved on both workpieces. The spark gap ionisation voltage on the left may be 100V, and on the right 300V. The capacitive load on the left may be 1 nf, and on the right 110 pF. The digital control circuit modifies the current of the drive waveform to be 1.0 Amp on the left, and 0.11 Amp on the right. This causes both sides to have a constant dv/dt of 1000V/μs and a constant discharge energy of 5 μJ. As the spark energy can be maintained at a low level over large spark gap sizes, surfaces can be finish machined with better flushing efficiency.

FIG. 16b illustrates the use of the EDM drive circuit of FIG. 12 in rough machining. A very high pulse energy is used which generates a rougher surface on the workpiece. In this example, the spark gap ionisation voltage may be 300V and the capacitive load 22 nF. The digital control circuit modifies the current of the drive waveform to be 22.0 Amp. This causes a constant dv/dt of 1000V/μs, which is the same as that achieved for the fine machining of FIG. 16a. A larger discharge energy of 1 mJ creates the rougher surface of the workpiece. Thus, the same EDM drive circuit is able to operate in the nJ and mJ pulse energy domains.

Figure 17A:
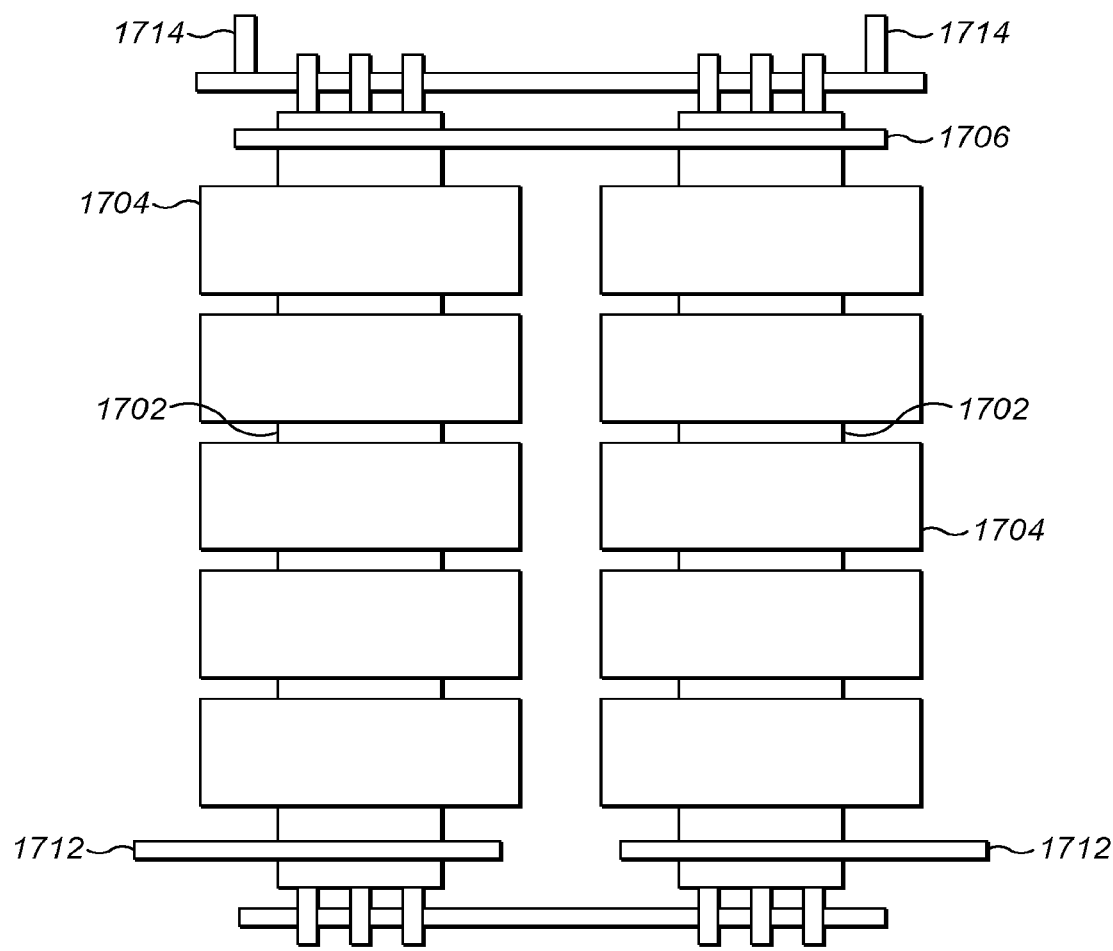
FIGS. 17a and 17b illustrate a transformer for use in an EDM drive circuit.
Figure 17B:
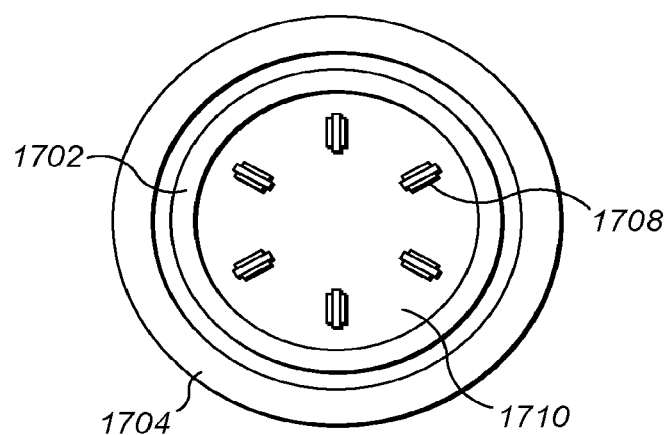

FIGS. 17a and 17b illustrate an exemplary transformer which can be used as transformer 1212 of the EDM drive circuit. Transformer 1212 can also be used as part of a 3D printing or power supply (e.g. a switched mode power supply) drive circuit. This transformer is a high frequency, low leakage inductance pulse transformer.

The transformer primary has primary windings 1712 which are connected to arms 1702 that pass through a magnetic material. The magnetic material may comprise one or more toroidal cores 1704. This is easily seen in FIG. 17b, which is a cross sectional view through one of the tube arms of FIG. 17a. Passing the primary through the centre of the toroidal magnetic cores ensures the best coupling of the primary to the cores and results in the smallest stray field, which contributes to leakage inductance. The arms 1702 may be copper tubes. The copper tubes have a large surface area. The skin effect constrains the current flow to the outside of conductors at high frequency, increasing their impedance. By utilising large surface areas on the inside and the outside of the copper tubes, the skin effect is reduced.

This allows the electrical path to have a low inductance at high frequency. The arms 1702 may be connected by a shorting bar 1706.

The transformer secondary has secondary windings 1714 connected to secondary conductors 1708 which pass through the inside of the primary copper tube. This enables greater coupling of primary to secondary as they both experience the same magnetic flux. The secondary conductors may be planar. The secondary conductors may comprise three planar layers, in which a copper foil layer is attached to either side of a PCB. The planar construction of the secondary conductors reduces the inductance of the secondary conductors at high frequency. The secondary conductors may be perpendicular to the side walls of the primary. This causes the smaller height dimension (which may be in the range 35-100 µm) of the secondary inductor to be facing the side wall of the primary rather than the larger width (which may be in the range 2-5 mm) dimension. This causes a lower capacitive coupling between the primary and the secondary. The secondary conductors 1708 may be arranged in a radial formation separated by insulator 1710 inside the primary. The secondary conductors may be equally spaced apart from each other within the primary tube. The larger face of each secondary conductor is offset from parallel with the larger face of the secondary conductors adjacent to it. For example, in a 6 turn secondary as depicted in FIG. 17, the larger faces of the secondary conductors are offset at an angle of 60° to each other. This reduces the intra winding parasitic capacitance to a very low level, further reducing the stored energy.

Use of the transformer of FIGS. 17a and 17b in the EDM drive circuit of FIG. 12 enables the pulse energy of each EDM pulse to be in the range 5 nJ to 50 mJ. This is a larger dynamic range than known systems. The transformer when used in the EDM drive circuit is able to generate pulse repetition rates of greater than 1 MHz.

Figure 18:
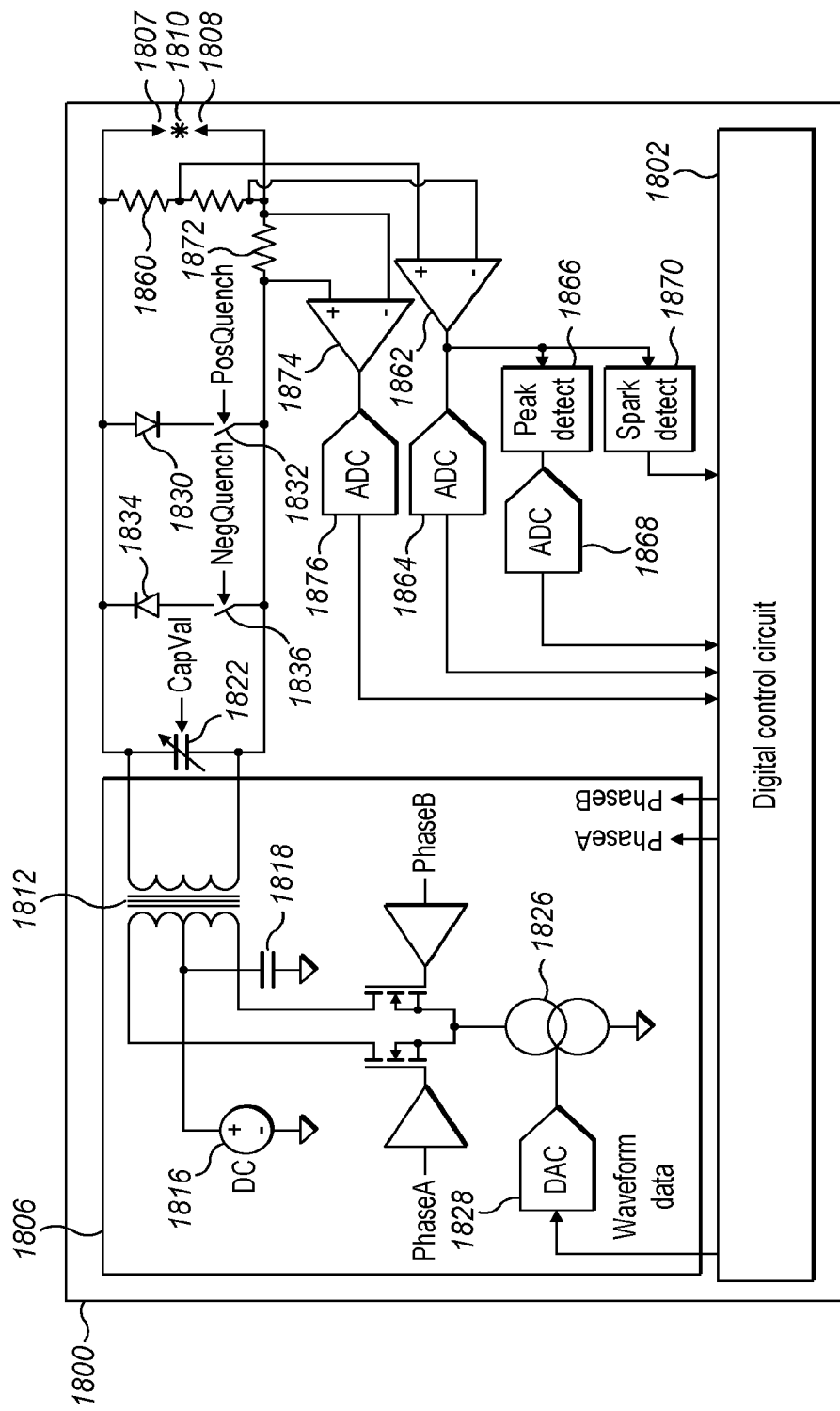
FIGS. 18, 19 and 20 illustrate further EDM drive circuits.

FIG. 18 illustrates a further EDM drive circuit. This is the same as the EDM drive circuit of FIG. 12 except that the transformer 1812 of the drive circuit 1806 is a push-pull wound transformer of the type known in the art. This EDM drive circuit operates as described with respect to FIG. 12, but transformer 1812 has a higher leakage inductance than transformer 1212, and hence the EDM drive circuit of FIG. 18 cannot produce the very low EDM pulses of the drive circuit of FIG. 12. The EDM drive circuit of FIG. 18 may further comprise auxiliary current sources (not shown) to drive large pulse energies, as described with respect to FIG. 12.

Figure 19:
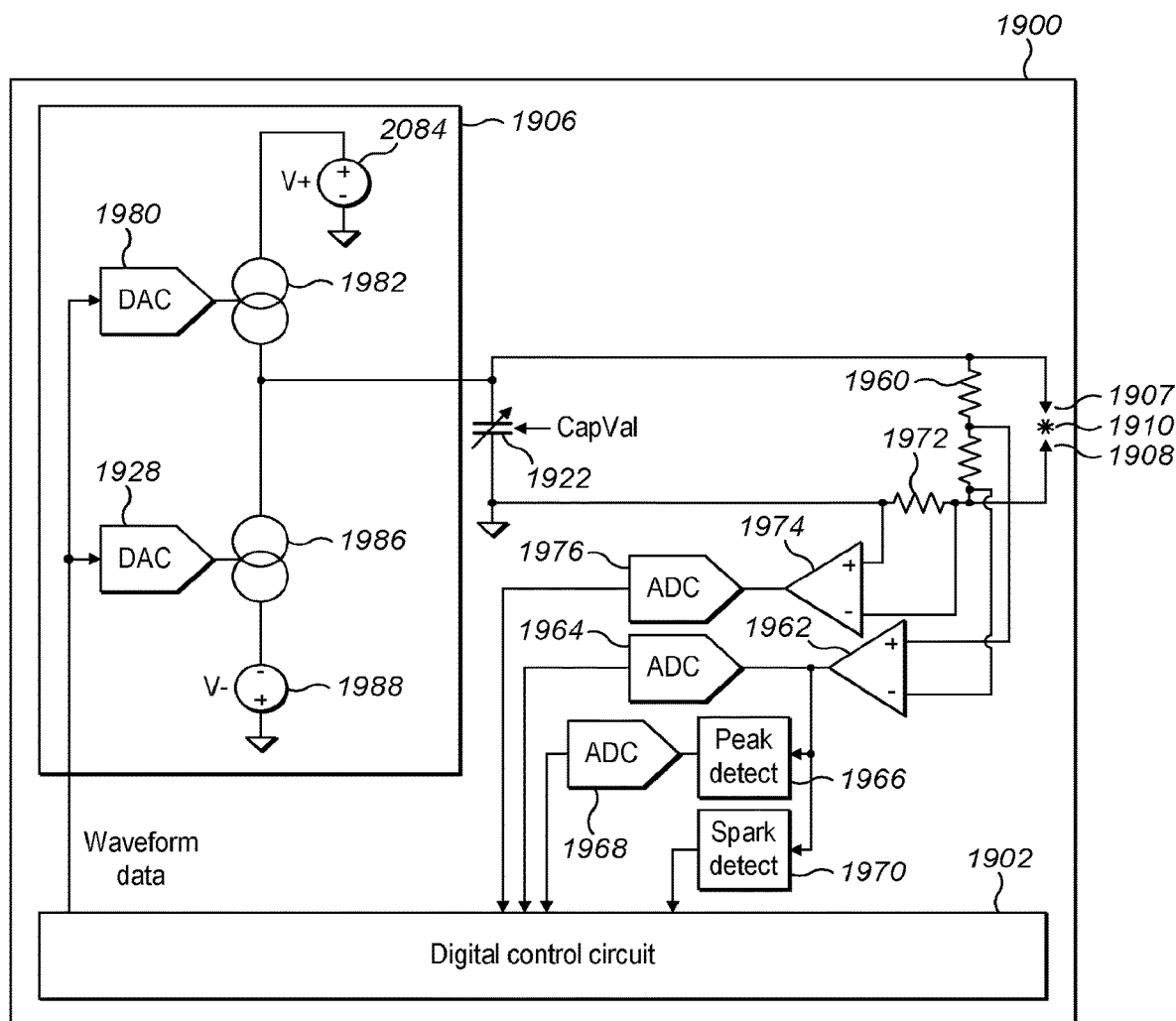

FIG. 19 illustrates a further EDM drive circuit. This is the same as the EDM drive circuit of FIG. 12 except that the drive circuit 1906 directly couples two current sources 1982 and 1986 to the variable capacitor 1922 under the control of the digital control circuit 1902. The slewing circuit of the drive circuit 1906 is connected and operates as described with respect to the slewing circuit of FIG. 4. The EDM drive circuit of FIG. 19 may further comprise auxiliary current sources (not shown) to drive large pulse energies, as described with respect to FIG. 12.

Figure 20:
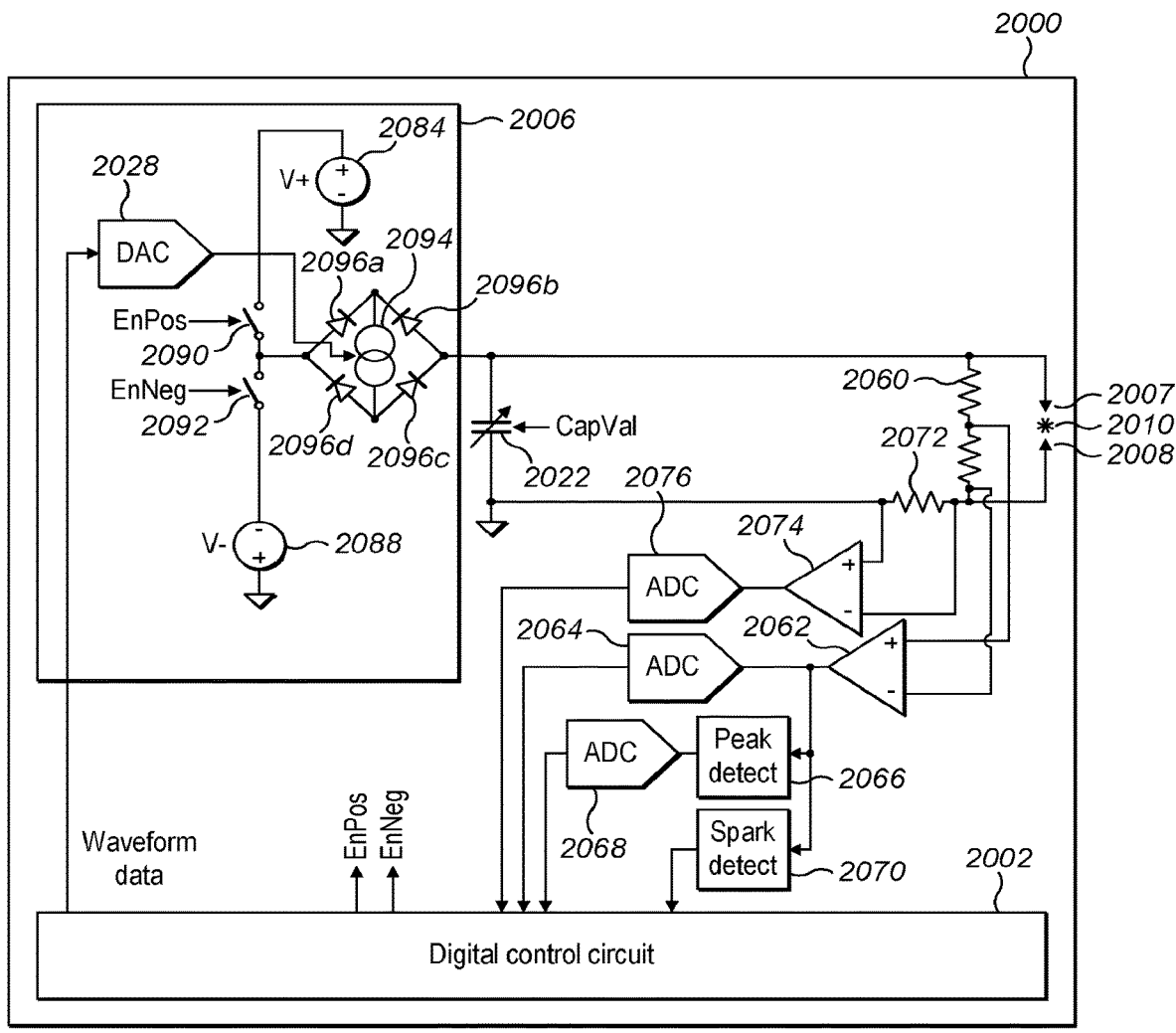

FIG. 20 illustrates a further EDM drive circuit. This is the same as the EDM drive circuit of FIG. 12 except that the drive circuit 2006 directly couples a single current source 2094 to the variable capacitor 2022 under the control of the digital control circuit 2002. The slewing circuit of the drive circuit 2006 is connected and operates as described with respect to the slewing circuit of FIG. 5. The EDM drive circuit of FIG. 20 may further comprise auxiliary current sources (not shown) to drive large pulse energies, as described with respect to FIG. 12.

The response time of the current sources of FIGS. 19 and 20 preclude operation down to the 5 nJ level. This is because the energy in the current source pass transistors that is released into the spark gap when it ionizes is not interrupted as quickly as when the high frequency, low leakage inductance pulse transformer 1202 of FIG. 12 is used. Thus, a higher energy has flowed into the spark gap before it is halted.

The EDM drive circuits described herein produce an EDM pulse with a more controlled and lower dv/dt, with no overshooting of the maximum desired ionisation voltage. This reduces signal ringing and also reduces the signal reflections suffered by known systems. This enables longer cables to be used.

The EDM drive circuits described herein enable very low energy EDM pulses to be generated. These very low energy EDM pulses have ionisation voltages of up to 300V. Thus, fine finishing is possible without having to use very small spark gaps as in known systems. By using a larger spark gap, flushing of the eroded region is more effectively carried out, which results in higher quality surface finishes.

In the following example, the circuitry of FIG. 1 is used in 3D metal printing.

Known 3D metal printing is implemented using a laser sintering process. The laser sintering process uses a bed of powder which is scraped over the top surface of the workpiece and then melted or fused to the surface below, using a focused laser.

Advances in laser technology have made it possible to use solid state/dye lasers, rather than gas lasers and q-switched crystal lasers such as Neodymium doped glass. The former are lower cost, lower maintenance and more robust than the latter. This has reduced the cost of the machines and allowed the technology to gain more widespread use in the industry, but laser sintering machines are still high cost instruments and the parts made on them are very much more expensive than parts made by conventional subtractive manufacturing. Some attempts have been made to improve the precision of the laser sintering process by adding high speed milling spindles to sintering machines, so that critical areas can be machined in process.

Research into the use of 2D printheads to print plastics and even metals in suspension is underway, but the later requires the part to be fired in an oven or otherwise heated in order to remove the suspension medium. A third process may be required if low porosity is required to fill the voids created by this approach.

Figure 21:
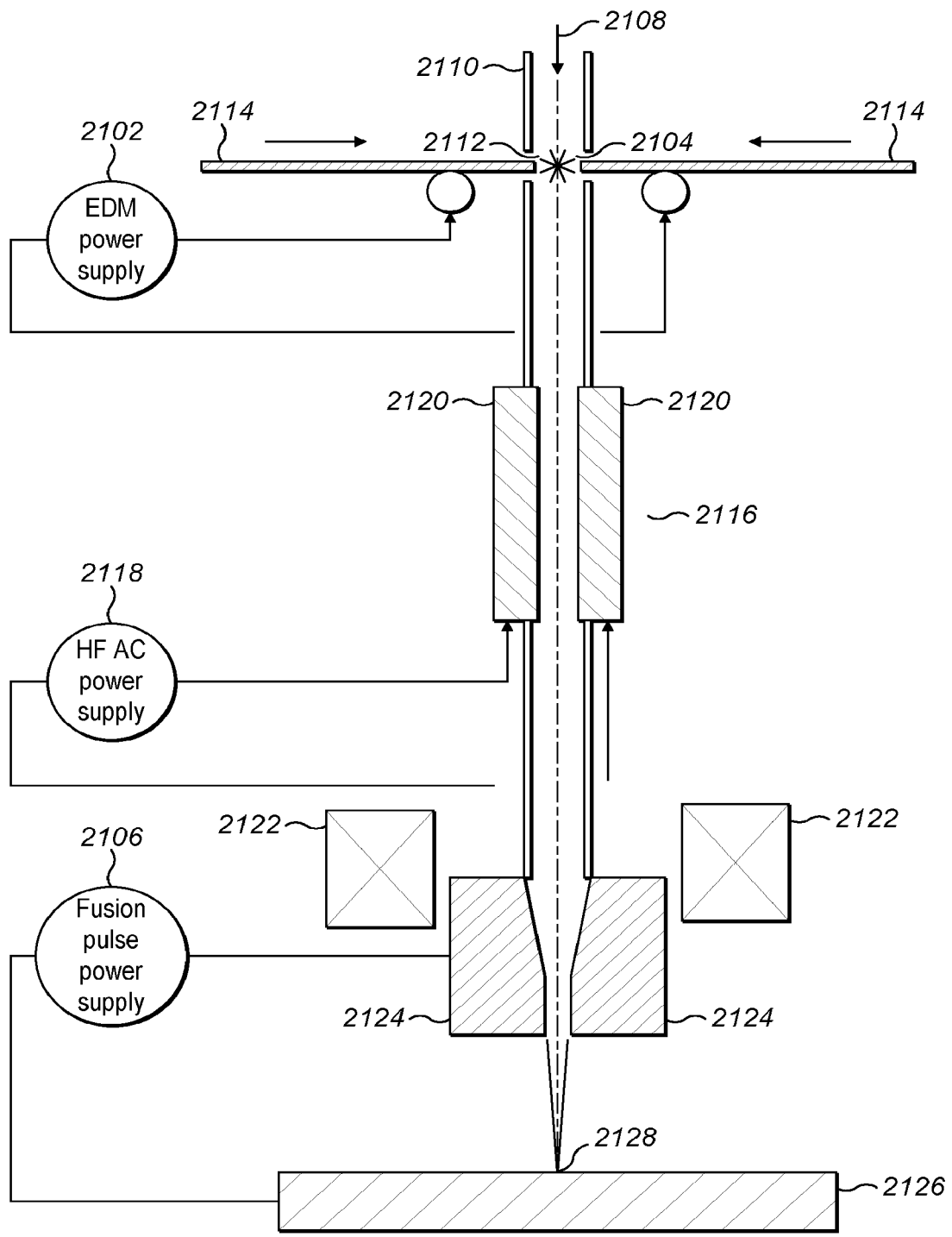
FIG. 21 illustrates a 3D metal printer architecture.

FIG. 21 illustrates a 3D metal printer architecture which utilises the drive circuitry of FIG. 1. EDM drive circuitry 2102 uses the drive circuitry of FIG. 1 to generate energy pulses which generate material source voxels 2104. A fusion pulse power supply 2106 also uses the drive circuitry of FIG. 1 to control charging of a variable fusion energy storage capacitor which is discharged into the plasma flow to fuse the voxel onto the workpiece.

Inert gas, such as nitrogen or argon, is fed to the top of the printhead 2108. This gas is fed in at a controlled pressure and mass flow rate. The gas flows along a quartz or other insulating tube 2110 to the EDM source cell 2112. Two wires of source material 2114 are fed coaxially into the source cell, leaving a spark gap (of the order 10-30 um) in the centre. The EDM power supply 2102 generates an EDM pulse for every voxel of material that is to be printed. The desired size of the voxel is dependent on the precision of print resolution needed in that printing cycle. The size of the voxel is determined by the energy discharged between the two wires 2114. The energy discharged between the two wires is controlled by the EDM drive circuit, as described in detail above. The spark gap size is determined precisely as described above. The digital control circuit of the EDM drive circuit modifies the digital drive signal to the drive circuit as described above to maintain a constant voltage ramp rate dv/dt whilst the variable capacitor is charging to ensure that the spark gap between the wires remains a constant size. The spark gap size is maintained by feeding the source material wires 2114 into the EDM source cell 2112 as the source material is eroded to form the voxels. The spark gap can be maintained in the centre of the EDM source cell using a charge coupled device (CCD) sensor (not shown) which detects photons which are emitted as the gas is ionized. The digital image output by the CCD sensor is processed to determine where the start and end point of each discharge is in the EDM source cell.

The voxel is then forced down the tube by the flow of the gas and by gravity. The voxel passes through an RF capacitively coupled plasma generation cell 2116. Here, the gas is ionized between electrodes 2120 by energy supplied from the HF AC power supply 2118. The plasma remains in a non-thermal equilibrium state.

The voxel proceeds further down through the printhead where the plasma is constrained and focused by magnetic lenses 2122. These lenses confine the plasma to the centre of the printhead. The source material voxels tend to align to the centre of the tube as the pressure is lowest there. This is because the velocity of the gas/plasma is highest in the centre of the tube. The velocity of the gas/plasma is lower at the tube walls due to friction.

The plasma and material voxels then pass through output electrode 2124. Electrode 2124 may be made of graphite. Suitably, electrode 2124 is water cooled and gas cooled through high pressure application of the inert print gas (for example nitrogen or argon) through the porous structure of the electrode.

The plasma column converges as a result of the magnetic lenses. The workpiece 2126 is positioned such that the focal point 2128 of the plasma is on the surface of the workpiece, where the source material is to be fused.

Energy to fuse the source material to the workpiece is supplied by the fusion pulse power supply 2106. The desired energy supplied in each energy pulse is dependent on the source material volume of the voxel. The energy is supplied using the drive circuitry of FIG. 1 by a variable capacitor which is charged to a high voltage (such as 200V-2 KV) and then discharged into the plasma over a short period (for example 2-20 ns). The current during discharge may reach up to 50-500 Amps. The digital control circuit of the drive circuitry modifies the digital drive signal to precisely regulate the voltage discharged at the fusion pulse power supply 2106 to be the desired voltage regardless of pulse repetition rate. The peak power of the fusion pulse power supply 2106 may be in the range 10-200 KW.

Figure 22:
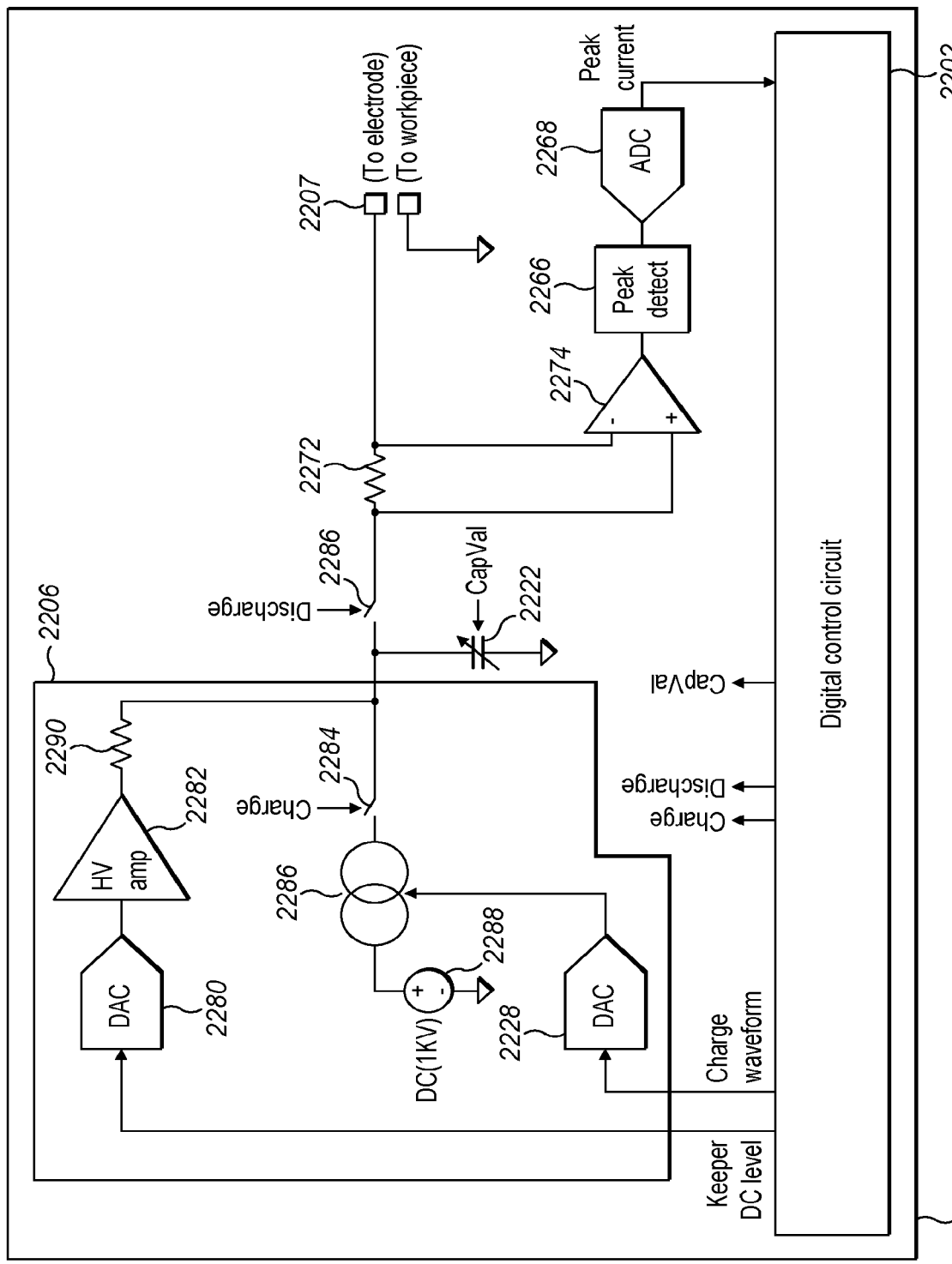
FIG. 22 illustrates a fusion pulse power supply drive circuit.

FIG. 22 illustrates an exemplary fusion pulse power supply drive circuit. Digital drive circuit 2202 generates a digital drive signal which drives drive circuit 2206 to produce an analogue drive signal for charging the variable capacitor 2222 which is subsequently discharged between the electrode 2207 and workpiece 2208.

Drive circuit 2206 comprises a keeper circuit comprising DAC 2280, voltage amplifier 2282 and resistor 2290. The digital drive signal from digital control circuit 2202 is input to DAC 2280. The output of DAC 2280 is input to voltage amplifier 2282. The output of the voltage amplifier 2282 is input to resistor 2290. The output of resistor 2290 is connected to the output of the drive circuit 2206. The keeper circuit drives a static voltage component of the analogue drive signal output from the drive circuit 2206. The HV voltage amplifier 2282 is driven to the terminal voltage of variable capacitor 2222. This ensures that the variable capacitor 2222 remains at the desired discharge voltage regardless of any leakage currents in the fusion pulse power supply drive circuit.

Drive circuit 2206 comprises a slewing circuit comprising DAC 2228, current source 2286, DC voltage supply 2288 and switch 2284. DC supply 2288 may be variable. DC supply 2288 may have a range from 100V to 2 KV. DC supply 2288 may have a range from 100V to 1 KV. DAC 2228 receives a digital drive signal from digital control circuit 2202. Current source 2286 is connected to DC supply 2288, and is driven by DAC 2228 under the control of digital control circuit 2202. Switch 2284 is between the output of the current source 2286 and the output of the drive circuit 2206.

Figure 23A:
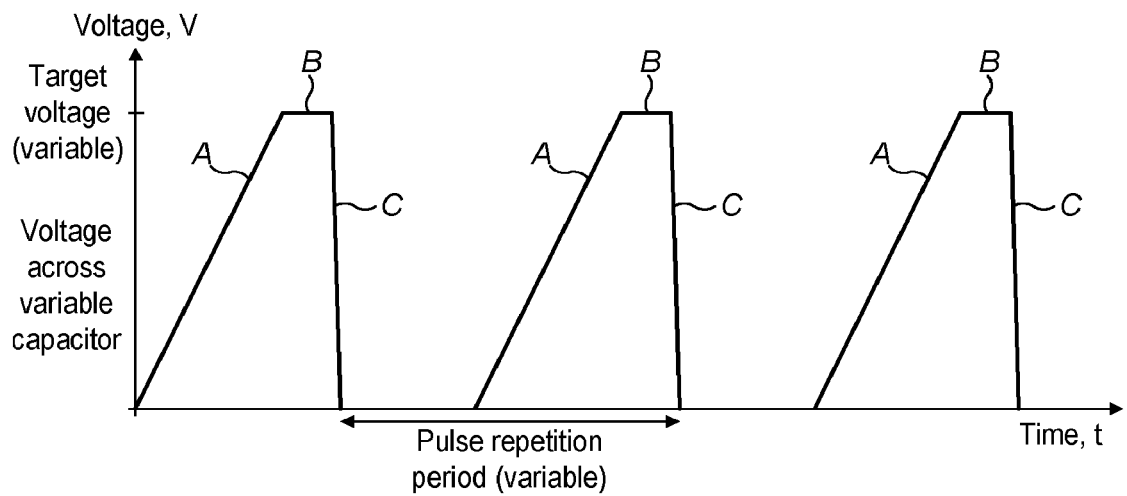
FIGS. 23a, 23b and 23c illustrate plots for charging cycles of the fusion pulse power supply drive circuit.

The analogue drive signal output from the drive circuit 2206 charges variable capacitor 2222. There is a switch 2286 between the variable capacitor 2222 and the electrode and workpiece. To initiate a capacitor charge cycle, switch 2284 is closed, switch 2286 is opened and current source 2286 is driven with current from DAC 2228 under the control of digital control circuit 2202. The capacitor 2222 charges to its terminal voltage. This is shown in FIG. 23a, by the linear voltage ramps labelled A.

Once the terminal voltage has been reached, the voltage amplifier 2282 maintains this voltage until the source material reaches the workpiece. This is marked B on FIG. 23a. The time to maintain the terminal voltage is determined by the digital control circuit, or received by the digital control circuit from a system controller. The time for the voxel to reach the workpiece 2126 is determined from the known velocity of the gas in the printhead and the distance between the spark gap 2112 in the source material and the workpiece 2126. The terminal voltage is maintained for this time period after a timestamp of the EDM pulse spark.

Figure 23B:
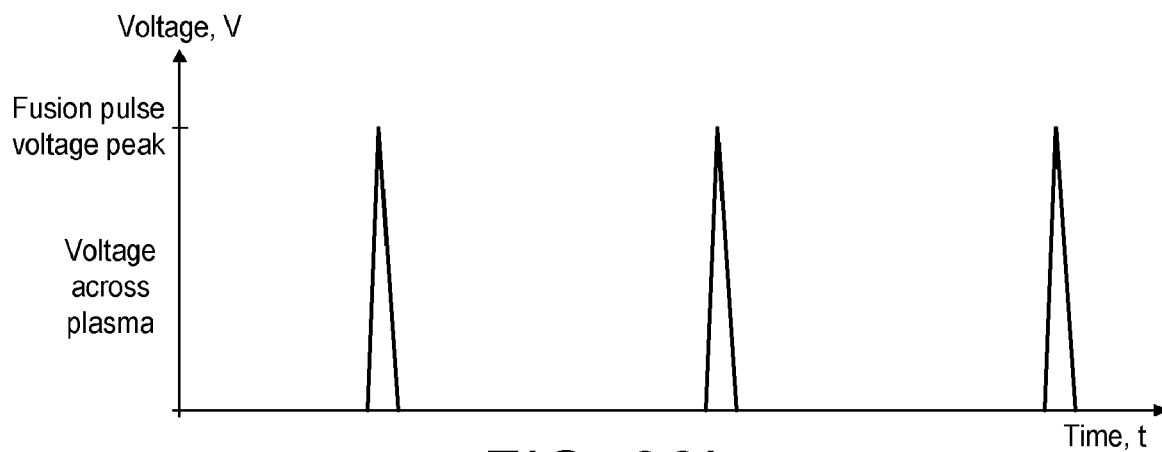
Figure 23C:
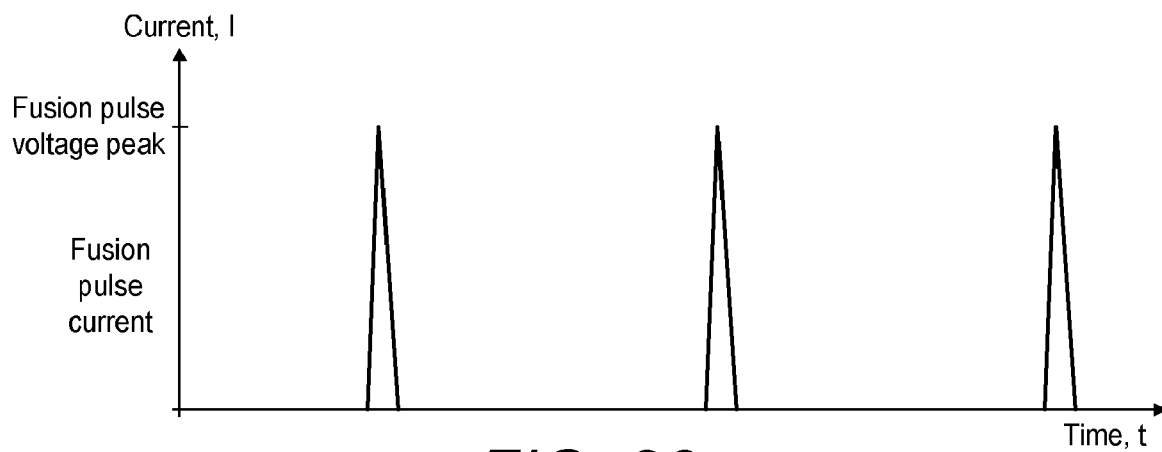

Under the control of digital control circuit 2202, the switch 2284 is then opened coincident with the switch 2286 being closed. This connects the charged capacitor 2222 between the output electrode and the workpiece. The charge in the capacitor 2222 flows through the low resistance of the plasma, raising its temperature rapidly. FIG. 23a shows the rapid discharge of the capacitor, marked C. With very low inductance, planar interconnect between the fusion pulse power supply and the output electrode and workpiece, the current rises rapidly. For example, 1 KV discharged across 10 Ohms may result in 100 Amps. The current rises to this level in a few nanoseconds. FIG. 23b shows the rapid rise in voltage across the plasma, and FIG. 23a shows the rapid rise in current through the plasma. The charge in the capacitor flows through the plasma, where the stored energy is dissipated.

The current through the plasma in each charging cycle is sensed and fed back to the digital control circuit 2202. Series resistor 2272 is connected between switch 2286 and the electrode 2207. The signal at either side of the series resistor 2272 is fed to differential amplifier 2274. Alternatively, an RF current transformer may be used to detect the plasma current. The output of the differential amplifier 2274 is input to peak detector 2266. The output of the peak detector 2266 is input to ADC 2268. The output of ADC 2268 is input to digital control circuit 2202. Peak detector 2266 detects the peak current which is digitized by ADC 2268 and output to the digital control circuit 2202. The digital control circuit calculates the plasma resistance of that charging cycle from the peak current and the known voltage that the variable capacitor 2222 has been charged to in that charging cycle. The energy delivered to the CCP plasma generation cell by electrodes 2120 is modulated by the AC power supply 2118 in dependence on the calculated plasma resistance, so as to maintain a constant plasma resistance through the plurality of cycles of the printing operation.

The volume of each source material voxel to be printed is provided to the digital control circuit. The rate at which the voxels are to be printed is also provided to the digital control circuit. The voxel volume may differ from charge cycle to charge cycle. The digital control circuit modifies the capacitance of the variable capacitor 2222 in each charge cycle to change the terminal voltage of the capacitor such that it stores the desired energy for the volume of source material in the voxel of that charge cycle. The digital control circuit also modifies the digital drive signal sent to the drive circuit 2206 in each charging cycle to cause the keeper circuit to generate a keeper voltage of the terminal voltage of the capacitor for that charging cycle. The digital control circuit also modifies the digital drive signal sent to the drive circuit 2206 in each charging cycle to cause the slewing circuit to generate an analogue drive signal having a time dependent voltage component which has a linear slew rate of the desired magnitude to cause the capacitor 2222 to be charged in time to generate a pulse at the desired time. If the print rate is desired to be increased, then the digital control circuit speeds up the charging cycles by increasing the ramp rate dv/dt to charge the capacitor 2222 more quickly, and switching switches 2284 and 2286 more quickly to discharge the capacitor 2222 into the plasma more quickly. The digital control circuit thereby causes the desired amount of energy to be delivered to the focal point of the plasma flow at the desired time for each fusion pulse to melt and fuse the volume of the source material in the voxel of the current charge cycle to the workpiece.

The fusion pulse power supply drive circuit 2200 may further comprise circuitry for preventing the voltage across the variable capacitor from overshooting the target high voltage, Vhigh, during a charging cycle. This circuitry may comprise a comparator (not shown on FIG. 22) which receives a sensed voltage signal. The voltage signal may be sensed as described with respect to the EDM pulse power supply drive circuit of FIG. 12. The digital control circuit 2202 generates a threshold voltage which it outputs to a DAC. The DAC converts the threshold voltage to an analogue threshold voltage which it inputs to the comparator. The comparator compares the sensed voltage signal to the analogue threshold voltage. The output of the comparator changes state when the sensed voltage signal crosses the analogue threshold voltage. The comparator output is input to the digital control circuit 2202. When the comparator changes state, the digital control circuit stops outputting the digital drive signal to the drive circuit 2206. The digital control circuit may, in response to the comparator changing state, stop generating the digital drive signal.

The drive circuit has a non-negligible turn off time, Toff. The digital control circuit generates the threshold voltage in dependence on the known linear slew rate dv/dt, and the turn off time Toff, such that the maximum voltage of the drive waveform which charges the capacitor 2222 is Vhigh. Vhigh may be chosen to be the terminal voltage for the capacitor for that charging cycle. Thus, by preventing Vhigh from being overshot, the amount of energy delivered to fuse the source material to the workpiece does not exceed the desired amount.

The EDM power supply 2102 may operate using one of the EDM drive circuits described above. The digital control circuit modifies the capacitance of the variable capacitor in each printing cycle such that its terminal voltage matches the energy to be discharged in the spark gap to cause a voxel of source material of the desired size to be generated for that printing cycle. The digital control circuit modifies the digital drive signal for each printing cycle so as to match the time dependent voltage component of the drive waveform to the capacitance of the variable capacitor for that printing cycle. Overshoot circuitry can be used to prevent overshooting of the terminal voltage of the capacitor. The digital control circuit modifies the digital drive signal for each printing cycle to ensure the dv/dt of the ionising pulse applied between the electrodes is stable and repeatable. This enables the spark gap size to be determined more accurately than known EDM systems. This ensures that the source cell discharge region is stationary and the material voxels all start in the printhead from the same location, which improves the accuracy of the printed parts compared to known EDM systems.

The EDM power supply drive circuit and the fusion pulse power supply drive circuit described herein ensure that, for each printing cycle, a voxel of the desired volume of source material is generated, and that the correct amount of energy to fuse that voxel to the workpiece is applied to the plasma at the correct time. The resulting printed part thus has the precise geometric form desired, and is also repeatable. The resulting printed part also has better metallurgical qualities compared to laser sintering. This is because the plasma flow is focused to a larger point on the surface of the workpiece than with laser sintering. This avoids the rapid and localised heating and cooling effect of laser sintering.

The voxel size can be varied on each charging cycle using the EDM power supply drive circuit described herein. The same EDM power supply drive circuit may be able to generate a voxel between 1 $\mu m^3$ and 10,000 $\mu m^3$. This enables, in the same printing operation, larger voxel sizes to be used to quickly print large areas of low geometric complexity, and smaller voxel sizes to be used to print areas of high geometric complexity, small detail geometry or if higher accuracy is desired.

The use of a plasma in non-thermal equilibrium allows precise control of the fusion energy such that the source material can be fused to the workpiece regardless of its melting point, from close to room temperature up to thousands of Kelvin.

The 3D metal printer described herein uses source material in wire form, whereas known sintering processes use metal powder. Metals are more readily available in wire form. One wire spool is easily and quickly exchanged for another. Thus, the 3D printer described herein enables print materials to be changed more easily than in sintering processes.

In a further example, the 3D metal printer architecture of FIG. 21 is modified using a laser to refine the fusion point of the source material. The EDM cell described generates the source voxels. The plasma transports the source material to the workpiece. This approach allows the plasma to provide a larger area of heating to improve the metallurgical qualities of the resultant part, while the laser provides the high power and precision focusing that results in higher precision of the final printed part.

In a further example, the fusion pulse power supply drive circuit 2200 may comprise a plurality of drive circuits 2206, each one driving a corresponding variable capacitor 2222 whose output can be switched into a circuit to discharge into the plasma. These drive circuits are arranged in parallel and controlled by the digital control circuit 2202 to be switched in quick succession. The capacitor driven by the first drive circuit discharges into the plasma reducing the plasma resistance to a first resistance (for example 10 Ohms). The capacitor driven by the second drive circuit then discharges into the plasma reducing the plasma resistance to a second resistance (for example 1 Ohm). The first and second discharges may have similar energies, but the second discharge reduces the resistance of the plasma more quickly due to the higher current. This approach allows the power dissipated to be arbitrarily increased, and is therefore used when the application/material requires very high power levels in order to be fused to the workpiece.

It is described above how using a current source 1226 having high impedance to charge a variable capacitive 1222 load via a transformer (specifically the transformer of FIGS. 17a and 17b) allows the charging to be effected at a precise rate (dv/dt). It also has the advantage that when the voltage across the variable capacitance 1222 (and therefore, the spark gap 1210) reaches the ionisation potential for the prevailing conditions between the spark gap electrodes 1207, 1208, the dielectric breaks down and there is a very rapid and exponential increase in conductivity. In such a situation, a voltage driven power supply (as opposed to current driven using current source 1226), having low impedance, would pass significant amounts of energy from the low impedance supply on the primary side of transformer 1222, through the transformer 1212, to the spark gap 1210 on the secondary side of transformer 1222. In order to stop this from happening, a control system would have to sense the increase in current and react to it, switching off or isolating the low impedance supply to the primary, to limit the energy transferred to the spark gap 1210. This is difficult to accomplish with comparators and switching transistors in a short time and, in this time, unwanted energy may be dumped into the ionised spark gap, affecting the machined surface finish (for EDM applications) and the size of the source material voxel (for 3D printing applications). Using a current source 1226, as soon as spark gap 1210 ionises and the impedance seen across transformer 1212 secondary drops (typically in less than 1 ns), current source 1226 will respond by increasing its impedance to maintain the commanded current flow. This results in the voltage across the primary rapidly dropping, in turn stopping the flow of energy from primary side to the secondary side. The magnetic flux within the transformer 1222 core drops rapidly as it is starved of magnetising current and it no longer functions as a transformer as all energy transfer is extinguished.

Figure 24A:
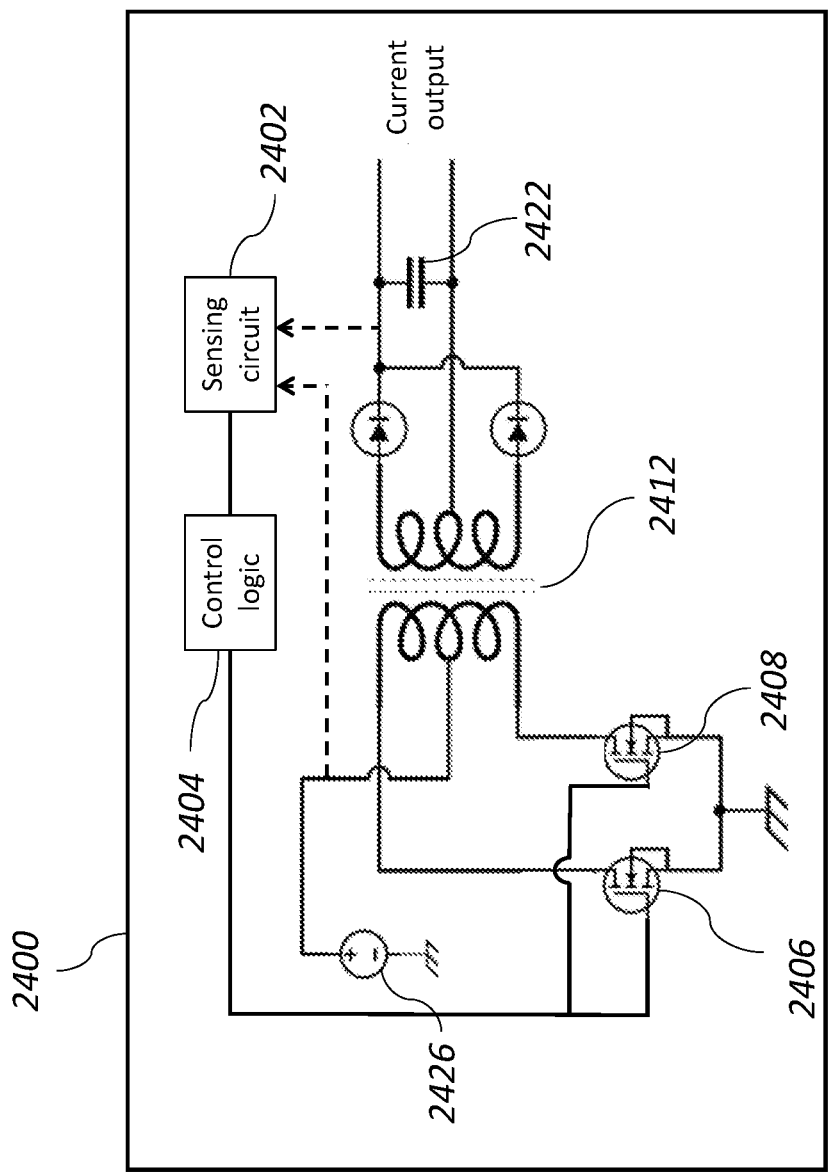
FIGS. 24a, 24b and 24c illustrate example drive circuits comprising the transformer of FIGS. 17a and 17b.

FIG. 24a illustrates a further example of a drive circuit, similar to the EDM drive circuit 1200 of FIG. 12. In contrast to drive circuit 1200 comprising a current source 1226, drive circuit 2400 comprises a voltage source 2426. Voltage source 2426 has a low impedance. Voltage source 2426 is configured to apply a voltage to the primary side of transformer 2412. Voltage source 2426 may be configured to apply a constant voltage, irrespective of the current delivered by the voltage source 2426. In other words, the voltage source 2426 may be configured to supply a range of currents by applying a constant voltage. Transformer 2412 may be of the kind described above with reference to transformer 1212. A capacitor 2422 may be connected to the secondary side of transformer 2412.

Capacitor 2422 has a fixed capacitance, in comparison to the variable capacitor 1222. The fixed capacitance may be provided by a fixed capacitance by having a fixed geometry. A current is output by the drive circuit 2400 at the secondary side to drive a load. The load may comprise an electrical load, for example a circuit that draws power. The output current may be a direct current.

Switching elements 2406, 2408 may be provided to enable voltage source 2426 to alternately provide positive and negative current through the transformer 2412. Switching elements 2406, 2408 may be respectively connected to the ends of transformer primary and ground (or a rail held at a reference voltage). Voltage source 2426 may be connected to the transformer primary part way along in a centre tap/tapped (CT) arrangement. A CT arrangement allows two fewer switching elements to be used, as can be seen from the comparison of the primary side shown in FIG. 24a (comprising two switching elements) and the primary side shown in FIG. 12 (comprising four switching elements in an H-bridge arrangement). If switching element 2406 is closed and switching element 2408 is open, a current will pass through the transformer 2412 in a first direction. If switching element 2408 is closed and switching element 2406 is open, a current will pass through the transformer 2412 in a second direction, the second direction being opposite to the first direction. Switching elements 2406, 2408 allow the primary to be alternately driven positive and negative by a single polarity voltage supply 2426. Switching elements 2406, 2408 may comprise transistors, for example field-effect transistors.

The capacitor 2422 shown in FIG. 24a may be connected to the secondary side of transformer 2412 in a CT arrangement. The centre tap is connected to a first side of capacitor 2422 and a second side of capacitor 2422 is connected to both ends of the transformer secondary via diodes. This CT arrangement acts to rectify the direct current output by the drive circuit 2400.

Drive circuit 2400 is particularly applicable to switched mode power supplies (SMPS). As SMPS generally require a much slower response (when compared to the nanosecond scale used in EDM and 3D printing applications of drive circuit 1200), the delivery of energy to a load on the secondary side of transformer 2412 can be controlled by a sensing circuit 2402 and control logic 2404. Sensing circuit 2402 may be connected to the transformer primary and/or the transformer secondary. The sensing circuit 2402 may be determined to measure voltage, current, or power. An error signal detected by the sensing circuit may be calculated by determining a difference between a desired output and a measured output. The control logic 2404 is configured to control the switching elements 2406, 2408. The control logic 2404 may also modify the voltage applied by voltage source 2426 in dependence on the determined error signal. Control logic 2404 may apply a modulation scheme whereby a digital or switched mode drive of the switching elements or H-bridges (as described below) is controlled.

Voltage source 2426 may be controllable such that the applied voltage can be modified as required by the particular application.

Figure 24B:
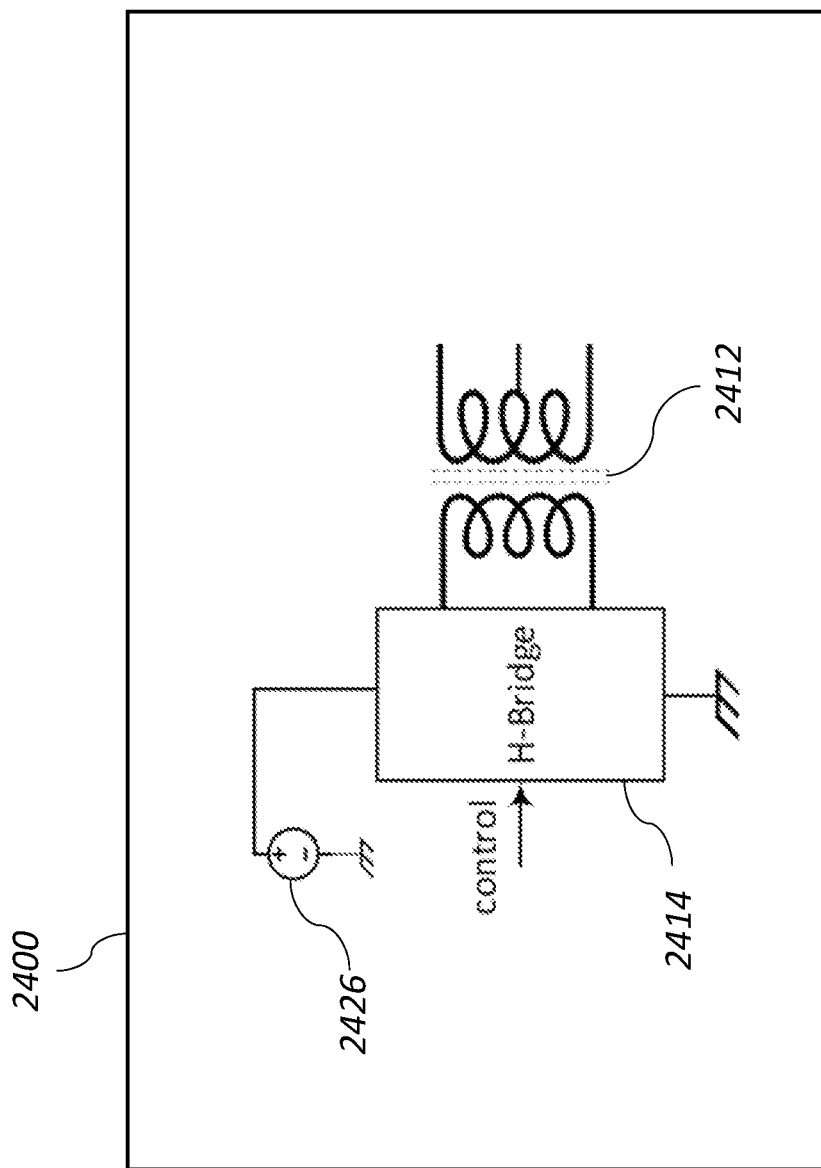

An alternative arrangement of drive circuit 2400 is shown in FIG. 24b. Instead of the switching elements 2406, 2408, FIG. 24b shows an arrangement in which voltage supply 2426 drives the transformer 2412 via an H-bridge 2414. H-bridge 2414 allows the single turn primary to be alternately driven positive and negative with the single polarity voltage supply 2426. When an H-bridge 2414 is used to control the driving of the transformer primary, the transformer primary need not have a CT arrangement. H-bridge 2414 may be controlled by control logic 2404 (not shown).

Control logic 2404 and the further circuitry connected to the transformer secondary have been omitted from FIG. 24*b* for clarity.

Figure 24C:
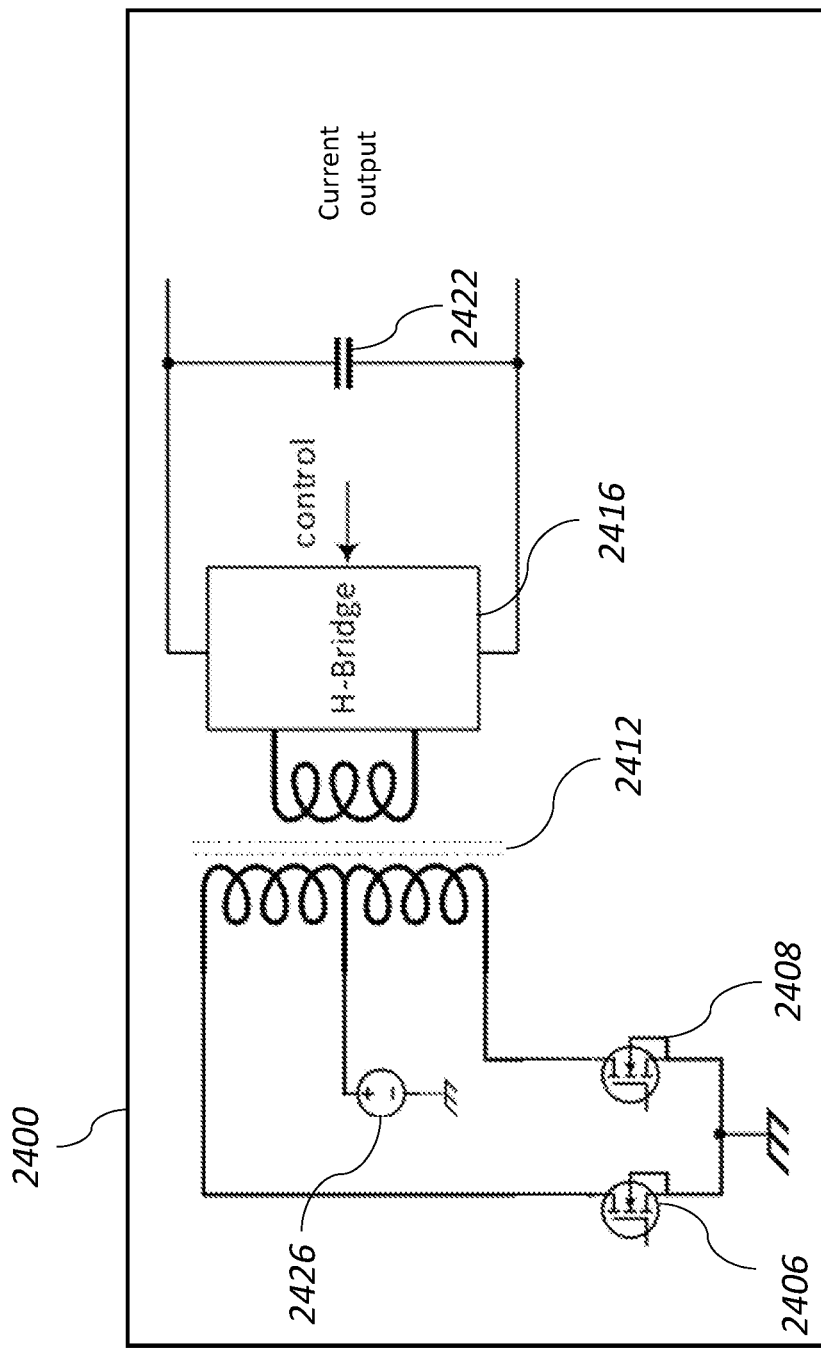

An alternative arrangement of drive circuit 2400 is shown in FIG. 24*c*. Instead of the CT arrangement with diodes on the secondary side of the transformer 2412 shown in FIG. 24*a*, an H-bridge 2416 is provided to rectify the output of the transformer secondary.

Any combination of the circuitry described as being connected to the transformer primary can be combined with any of the circuitry described as being connected to the transformer secondary. For example, the switching elements 2406, 2408 connected to the transformer primary may be provided in a circuit with the CT-diode arrangement connected to the transformer secondary (as shown on the right of FIG. 24*a*) or the H-bridge 2416 connected to the transformer secondary (as shown on the right of FIG. 24*c*). Similarly, the H-bridge 2414 connected to the transformer primary may be provided in a circuit with the CT-diode arrangement connected to the transformer secondary (as shown on the right of FIG. 24*a*) or the H-bridge 2416 connected to the transformer secondary (as shown on the right of FIG. 24*c*). The circuit topologies by which the transformer 1212, 2412 may be connected to the voltage source and the output load described herein are merely examples and further circuit topologies will be apparent to the skilled person.

Sensing circuit 2402 and control logic 2404 may be present in any of the circuits shown in FIGS. 24*a*, 24*b*, and 24*c* but have been omitted from FIGS. 24*b* and 24*c* for clarity.

FIGS. 25*a*, 25*b*, 26*a*, and 26*b* show further examples of cross-sectional views through an arm of the transformer 1212, 2412 as shown in FIG. 17*a*.

Figure 25B:
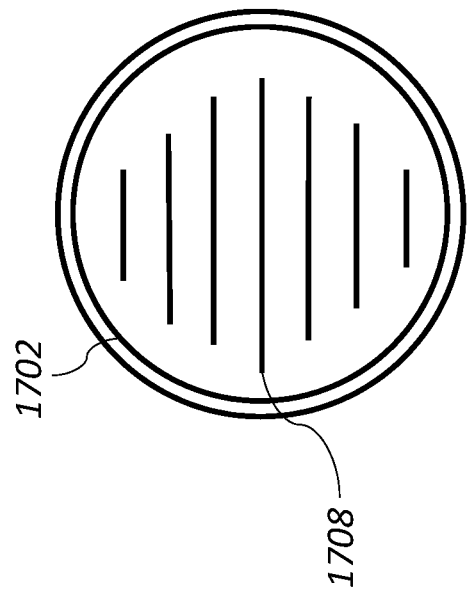
FIGS. 25a, 25b, 26a and 26b illustrate examples of transformer cross sections.
Figure 25A:
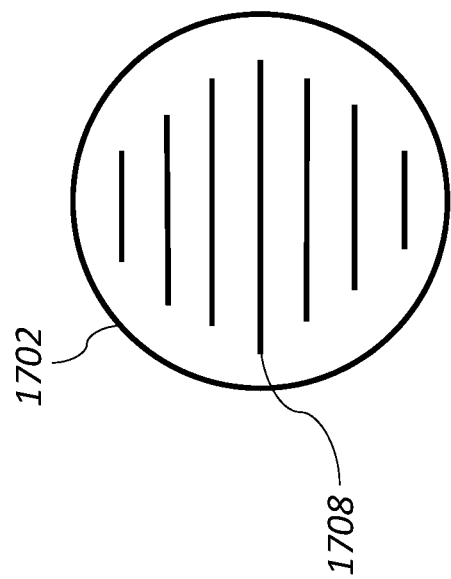

FIG. 25*a* shows an example in which the secondary conductors 1708 passing through the inside of arm 1702 comprise a plurality of parallel planar conductors. Planar secondary conductors 1708 are simple to manufacture and result in greater current density and winding space uses (when compared to the non-parallel conductors shown in FIG. 17*b*). FIG. 25*b* shows a similar arrangement comprising two coaxial tube arms 1702. This coaxial arrangement allows the coaxial tubes to be arranged as a CT winding. Similarly, the example arrangement shown in FIG. 17*b* may be provided with coaxial arms to allow them to be arranged as a CT winding.

Figure 26B:
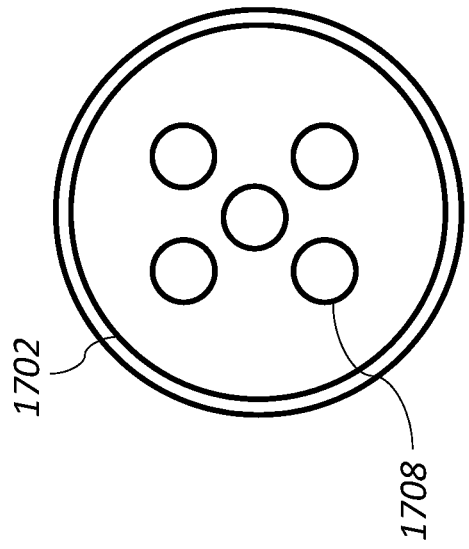
Figure 26A:
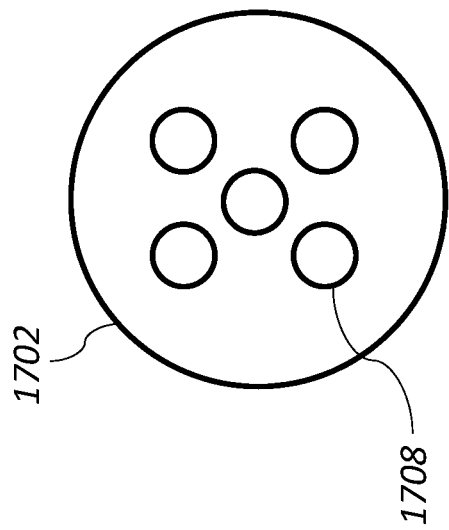

FIG. 26*a* shows an example in which the secondary conductors 1708 passing through the inside of arm 1702 comprise a plurality of tubular conductors or solid wires. This arrangement is simple to manufacture. Using multiple smaller conductors provides a greater surface area which reduces the skin effect and therefore affords a much lower impedance at high frequencies when compared to a system using a single, larger conductor. FIG. 26*b* shows a similar arrangement comprising two coaxial tube arms 1702.

Figure 27:
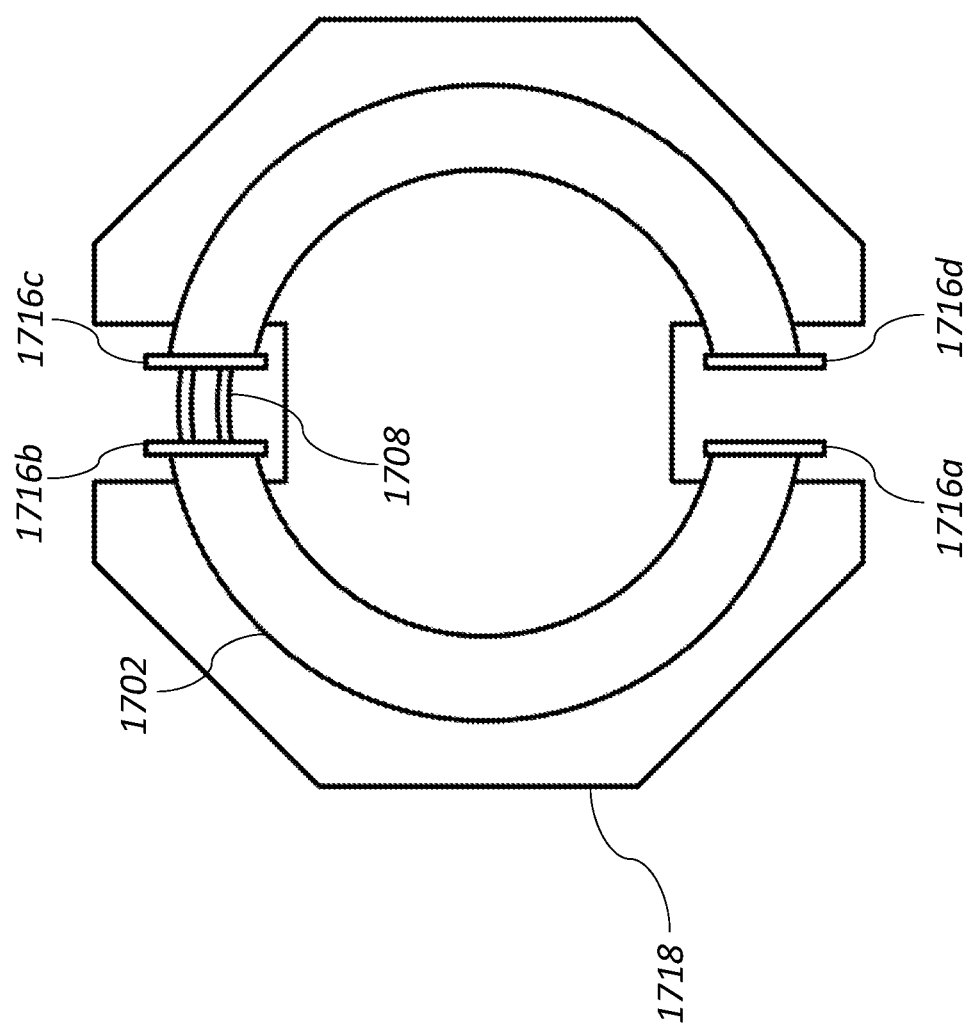
FIG. 27 illustrates an example of a transformer topology.

FIG. 27 shows an example of a transformer topology for transformer 1212, 2412. FIG. 25 shows an example transformer 1212, 2412 comprising two tubular arms 1702 with secondary conductors 1708 passing therethrough. Each tubular arm 1702 may be curved. As shown in FIG. 27, each tubular arm 1702 may lie on an arc, for example the arc of a circle or an ellipse. Each tubular arm 1702 may lie on the entirety of the perimeter of a circle or ellipse, or on more than 50%, 75%, or 90% of the perimeter of a circle or ellipse. As described above, the tubular arms may be coaxial such that a centre tapped primary can be used. Transformer 1212, 2412 may further comprise interconnects 1716*a*-*d* that provide connection points for the transformer to the remaining circuitry (i.e. the remainder of the circuitry shown in FIG. 12 or FIGS. 24*a*-*c*). One or more of interconnects 1716*a*-*d* may comprise PCBs. Each of interconnects 1716*a*-*d* may comprise PCBs. Two interconnects 1716*a*, 1716*d* may be positioned proximal to one another, and the remaining two interconnects 1716*b*, 1716*c* may be located proximal to one another and separated from the other two interconnects 1716*a*, 1716*d*. Transformer 1212, 2412 may further comprise a magnetic material 1718 that at least partially encloses the arms 1702. As described above, the magnetic material may comprise one or more toroidal cores. The magnetic material may comprise a single body with apertures through which the windings of the transformer extend. Preferably, the length of the transformer windings not within the magnetic material 1718 is minimal, in order to improve the coupling between the windings and therefore reduce the leakage inductance. The magnetic material may enclose more than 50%, 75%, 80%, 85%, 90%, 95%, or 99% of the length of the windings of transformer 1212, 2412. Insulation between arms 1702 and secondary conductors 1708 may comprise air or a high dielectric strength material, such as ceramic, plastic, or transformer oil.

Transformer 1212, 2412 may be driven at radio frequencies (RF). Radio frequencies are generally considered to correspond to frequencies from around 20 kHz to around 300 GHz. In particular, the switching elements 2406, 2408 or H-bridge 2414 may be configured to allow the primary to be alternately driven positive and negative by voltage source 2426 at radio frequencies. The transformer topology shown in FIG. 27, having tubular arms 1702 in a circular arrangement, is particularly suited for operation at radio frequencies. In particular, this transformer topology provides a high isolation and a high working voltage, and achieves this with exceptionally low leakage inductance. In contrast, conventional RF transformers only achieve high isolation with correspondingly high amounts of leakage inductance. Furthermore, the low leakage inductance experienced by the transformer shown in FIG. 27 allows for a wide operative bandwidth and low losses.

Resonant and quasi-resonant isolated converter circuits can be used with the transformer 1212, 2412. The converter circuits use inductor capacitor resonant tank circuits. It is common in LLC converters (Inductor-Inductor-Capacitor) to use the magnetising inductance of a transformer as one of the L elements and the other is implemented by the leakage inductance of a transformer. The capacitor may be an external, standard capacitor. The leakage inductance of the transformer is highly variable though as it depends on the precise position of the windings relative to each other and the transformer core. By reducing the leakage inductor to essentially zero, by using the transformer topology described above in reference to FIGS. 17, 25 and 26 the use of the leakage inductance for one of the inductors (the L elements) of the resonant tank is no longer possible. However, this allows a high precision external inductor to be used. This results in very much more precisely defined inductances and therefore, resonant frequency. This in turn, results in far better control of the efficiency variation in deployed systems.

Non-resonant converters switch when the voltages and currents in the converter are non-zero. This is commonly referred to as hard switching and results in very much higher transistor switching losses. Resonant converters cannot be used in all applications and often hard switching is necessary. In non-resonant converters, the efficiency may be improved by using the transformer topology described above in reference to FIGS. 17, 25 and 26. Generally, in a conventional transformer, every switching cycle, as the primary is energised, the leakage inductance stores energy. When the current is reversed, the leakage inductance generates a flyback voltage and this must be dissipated (i.e. snubbed) by a dissipative network or by active or passive clamping. All of these approaches dissipate the stored energy in the leakage inductance. Using the transformer topologies described herein, there is close to zero leakage inductance and therefore, the energy that needs to be dissipated or snubbed on each switching cycle, is close to zero. Hence, the described transformer topologies can greatly improve the efficiency of all isolated switching converters.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A drive circuit configured to drive a load, the circuit comprising:
   a transformer comprising:
      a transformer primary comprising one or more primary windings connected to arms that pass through a magnetic material; and
      a transformer secondary comprising secondary windings connected to secondary conductors, wherein the secondary conductors pass through the inside of the arms and wherein the secondary conductors are linear where they pass through the inside of the arms;
   wherein the drive circuit further comprises a voltage source configured to apply a voltage across the transformer primary.

2. The drive circuit of claim 1, further comprising two switching elements configured to enable current to be passed through the transformer primary in a first and a second direction, the second direction being opposite to the first direction.

3. The drive circuit of claim 2, wherein if the first switching element is closed and the second switching element is open, a current passes through the transformer primary in the first direction, and if the first switching element is open and the second switching element is closed, a current passes through the transformer primary in the second direction.

4. The drive circuit of claim 1, further comprising an H-bridge, wherein the voltage source is configured to apply a voltage across the transformer primary via the H-bridge.

5. The drive circuit of claim 1, wherein the voltage source is controllable to apply a desired voltage across the transformer primary.

6. The drive circuit of claim 5, further comprising a sensing circuit connected to the transformer secondary and configured to calculate an error signal by determining a difference between a desired output and a measured output.

7. The drive circuit of claim 6, further comprising control logic configured to modify the voltage applied by the voltage source in dependence on the determined error signal.

8. The drive circuit of claim 1, wherein the arms comprise copper tubes.

9. The drive circuit of claim 1, wherein the arms comprise coaxial tubes.

10. The drive circuit of claim 1, wherein the voltage source is connected to the transformer primary in a centre tap arrangement.

11. The drive circuit of claim 1, wherein a fixed-capacitance capacitor is connected to the transformer secondary.

12. The drive circuit of claim 1, wherein the secondary conductors are tubular or solid wires.

13. The drive circuit of claim 1, wherein the arms are curved.

14. The drive circuit of claim 13, wherein the arms lie on more than 50%, 75%, or 90% of the perimeter of a circle or ellipse.

15. The drive circuit of claim 1, wherein the secondary conductors are perpendicular to the side walls of the arms.

16. The drive circuit of claim 1, wherein the secondary conductors are arranged in a radial formation separated by an insulator inside the arms.

17. The drive circuit of claim 1, wherein the secondary conductors are equally spaced apart from each other within the arms.

* * * * *